United States Patent
Yang et al.

(10) Patent No.: US 9,466,724 B2
(45) Date of Patent: Oct. 11, 2016

(54) SEMICONDUCTOR DEVICES HAVING SOURCE/DRAIN AND METHOD OF FABRICATING THE SAME

(71) Applicant: SAMSUNG ELECTRONICS CO., LTD., Suwon-Si, Gyeonggi-Do (KR)

(72) Inventors: Changjae Yang, Seoul (KR); Shigenobu Maeda, Gyeonggi-do (KR); Changhwa Kim, Gyeonggi-do (KR); Youngmoon Choi, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 20 days.

(21) Appl. No.: 14/704,485

(22) Filed: May 5, 2015

(65) Prior Publication Data
US 2016/0093741 A1   Mar. 31, 2016

(30) Foreign Application Priority Data
Sep. 29, 2014   (KR) .................. 10-2014-0130492

(51) Int. Cl.
*H01L 27/12* (2006.01)
*H01L 29/78* (2006.01)
*H01L 29/04* (2006.01)

(52) U.S. Cl.
CPC ......... *H01L 29/7853* (2013.01); *H01L 29/045* (2013.01)

(58) Field of Classification Search
CPC .............. H01L 29/66795; H01L 29/0847; H01L 29/785; H01L 29/7853; H01L 27/1211; H01L 29/167; H01L 27/0924; H01L 29/045; H01L 29/7848; H01L 29/161; H01L 29/26; H01L 29/6656; H01L 29/66545; H01L 29/165; H01L 29/517; H01L 29/1608
USPC ........................................................ 257/347
See application file for complete search history.

(56) References Cited

U.S. PATENT DOCUMENTS

| | | | |
|---|---|---|---|
| 7,709,312 B2 | 5/2010 | Jin et al. | |
| 8,264,021 B2 | 9/2012 | Lai et al. | |
| 8,362,574 B2 | 1/2013 | Kawasaki et al. | |
| 2008/0111163 A1* | 5/2008 | Russ | H01L 29/458 257/280 |
| 2011/0042744 A1* | 2/2011 | Cheng | H01L 29/66795 257/347 |
| 2011/0193141 A1* | 8/2011 | Lin | H01L 29/045 257/255 |
| 2012/0115284 A1* | 5/2012 | Chien | H01L 29/66795 438/157 |
| 2013/0249003 A1 | 9/2013 | Oh et al. | |
| 2013/0285143 A1 | 10/2013 | Oh et al. | |
| 2013/0288456 A1* | 10/2013 | Lai | H01L 29/41791 438/478 |
| 2014/0027863 A1* | 1/2014 | Adam | H01L 29/16 257/410 |
| 2014/0042500 A1 | 2/2014 | Wann et al. | |
| 2015/0214369 A1* | 7/2015 | Fronheiser | H01L 29/045 257/192 |

FOREIGN PATENT DOCUMENTS

| | | |
|---|---|---|
| KR | 1020130107136 | 10/2013 |
| KR | 1020130120201 | 11/2013 |

* cited by examiner

*Primary Examiner* — Trung Q Dang
(74) *Attorney, Agent, or Firm* — F. Chau & Associates, LLC

(57) ABSTRACT

According to an exemplary embodiment of the present embodiment, a semiconductor device is provided as follows. An active fin protrudes from a substrate, extending in a direction. A gate structure crosses a first region of the active fin. A source/drain is disposed on a second region of the active fin. The source/drain includes upper surfaces and vertical side surfaces. The vertical side surfaces are in substantially parallel with side surfaces of the active fin.

12 Claims, 31 Drawing Sheets

SEMICONDUCTOR DEVICES HAVING SOURCE/DRAIN AND METHOD OF FABRICATING THE SAME

CROSS-REFERENCE TO RELATED APPLICATION

This application claims priority under 35 U.S.C. §119 to Korean Patent Application No. 10-2014-0130492 filed on Sep. 29, 2014, the disclosure of which is incorporated by reference herein in its entirety.

TECHNICAL FIELD

The present inventive concept relates to a semiconductor device having a source/drain and a method of fabricating the same.

DESCRIPTION OF RELATED ART

Recently, semiconductor devices are used in mobile devices as storage. For such application, semiconductor devices are being minimized to implement thin, lightweight mobile devices.

The reduction of the size of the semiconductor devices may cause adjacent source/drains of active fins to contact each other due to excessive lateral growth of source/drains. This may cause increased resistance due to an increased current path and reduction in a contact area.

SUMMARY

According to an exemplary embodiment of the present embodiment, a semiconductor device is provided as follows. An active fin protrudes from a substrate, extending in a direction. A gate structure crosses a first region of the active fin. A source/drain is disposed on a second region of the active fin. The source/drain includes upper surfaces and vertical side surfaces. The vertical side surfaces are in substantially parallel with side surfaces of the active fin.

According to an exemplary embodiment of the present inventive concept, a semiconductor device is provided as follows. A substrate has an active fin including a first region and a second region. A gate electrode crosses the first region of the active fin, covering at least one side of the first region of the active fin. A source/drain, adjacent to the gate electrode, is disposed on the second region of the active fin. A plug is connected to the source/drain. The source/drain includes upper surfaces and vertical side surfaces. The vertical side surfaces are in substantially parallel with side surfaces of the active fin.

According to an exemplary embodiment of the present inventive concept, a semiconductor device is provided. A plurality of active fins is spaced apart from each other. Each active fin protrudes from a substrate and extends in parallel to other active fins. A gate electrode crosses the plurality of active fins. Each source/drain is disposed on a part of a corresponding active fin of the plurality of active fins. The gate electrode does not cross the part of each active fin. Each auxiliary contact layer surrounds a corresponding sources/drain. Each sources/drain includes upper surfaces and vertical side surfaces located in a direction facing side surfaces of a corresponding active fin.

According to an exemplary embodiment of the present inventive concept, a method of fabricating a semiconductor device is provided as follows. An active fin protruding from a substrate and extending in a direction is formed. A gate structure is formed to cross a first region of the active fin. A source/drain is formed on a second region of the active fin by crystal growth so that the source/drain includes upper surfaces and side surfaces. The side surfaces are in substantially parallel with side surfaces of the active fin.

According to an exemplary embodiment of the present inventive concept, a semiconductor device is provided as follows. A first active fin is adjacent to a second active fin. A gate structure crosses the first and second active fins. A first source/drain is disposed on an upper part of the first active fin. A second source/drain is disposed on an upper part of the second active fin spaced apart from the second source/drain. A source/drain contact extends along the gate structure, disposing on the first and second source/drains. A first vertical side surface of the first source/drain is in substantially parallel with a second vertical side surface of the second source/drain. The first vertical side surface faces the second vertical side surface.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
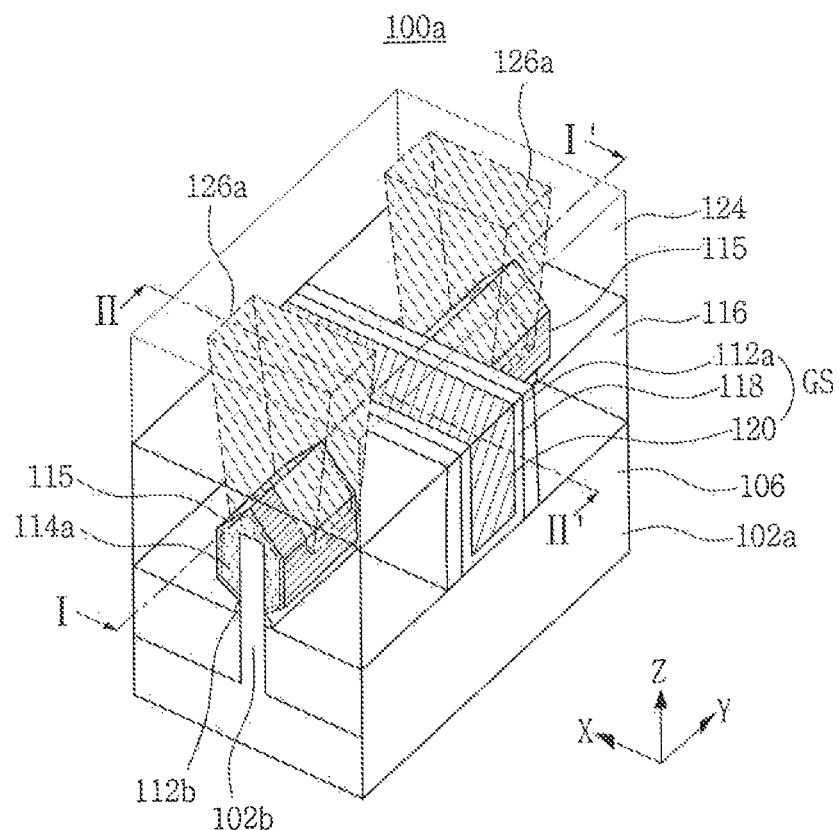
FIG. 1 is a perspective view of a semiconductor device in accordance with an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2:
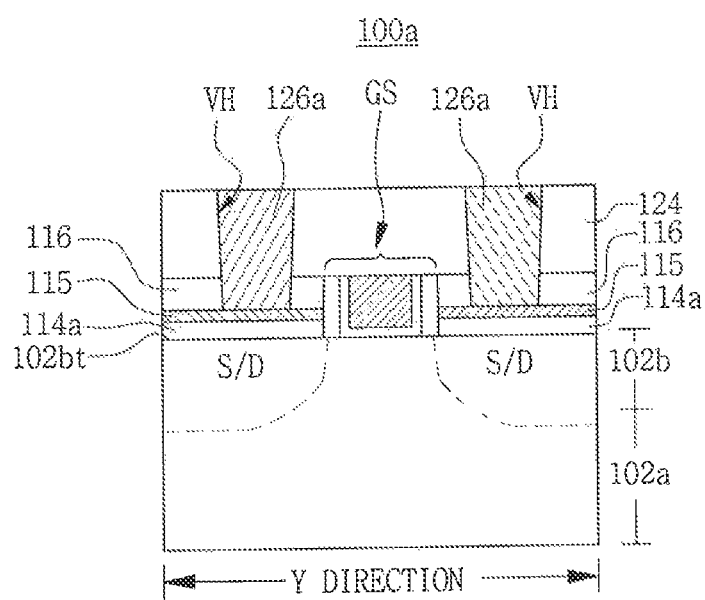
FIG. 2 is a cross-sectional view of FIG. 1, taken along line I-I' of a Y direction.
Figure 3:
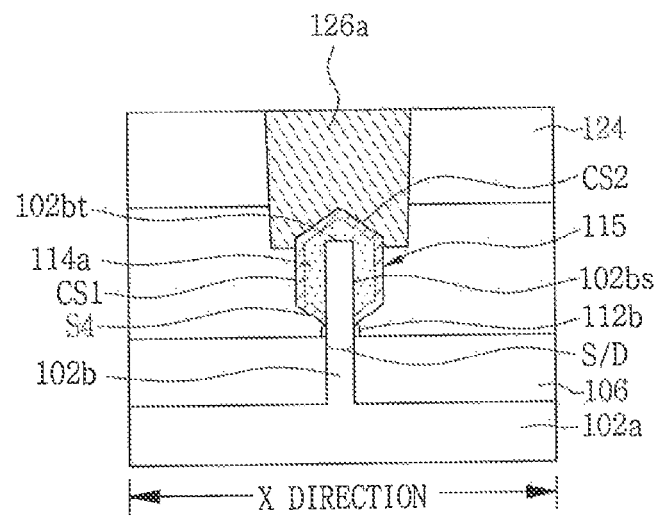
FIG. 3 is a cross-sectional view of FIG. 1, taken along line II-II' of an X direction.
Figure 4:
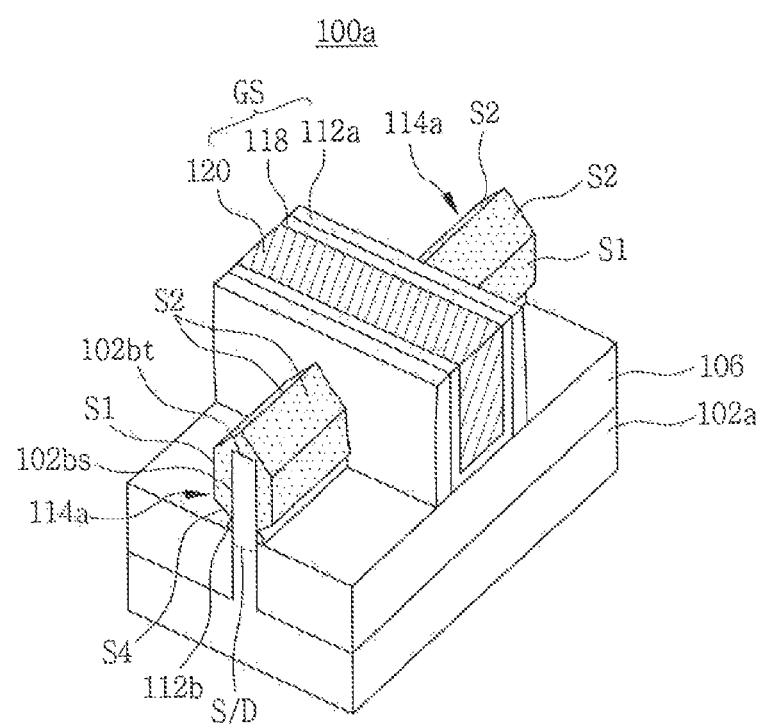
FIG. 4 is a perspective view of the semiconductor device of FIG. 1 having a source/drain exposed in accordance with an exemplary embodiment of the present inventive concept.

FIG. 1 is a perspective view of a semiconductor device in accordance with an exemplary embodiment of the present inventive concept. FIG. 2 is a cross-sectional view of FIG. 1, taken along line I-I' of a Y direction. FIG. 3 is a cross-sectional view of FIG. 1, taken along ling II-II' of an X direction. FIG. 4 is a perspective view of the semiconductor device of FIG. 1 having a source/drain exposed, according to an exemplary embodiment of the present inventive concept.

Referring to FIGS. 1 to 3, the semiconductor device 100a includes a substrate 102a, active fins 102b which protrudes from a surface of the substrate 102a, an isolation layer 106, a gate structure GS, sources/drains 114a formed by crystal growth, auxiliary contact layers 115, and source/drain contacts 126a. In an exemplary embodiment, the active fin 102b may be part of the substrate 102a. The isolation layer 106 covers the surface of the substrate 102a and lower side surfaces of the active fins 102b. The semiconductor device 100a also includes an interlayer insulating layer 116 which covers the isolation layer 106 and the auxiliary contact layers 115, and a protection layer 124 which covers an upper part of the interlayer insulating layer 116 and surrounds the source/drain contacts 126a.

The active fin 102b perpendicularly crosses the gate structure GS. The sources/drains 114a surround both sides of the active fin 102b which do not cross the gate structure GS. Each auxiliary contact layer 115 covers each source/drain 114a. Each source/drain contact 126a is in contact with each auxiliary contact layer 115 corresponding to each source/drain 114a.

The substrate 102a may include a {100}/<110> substrate or a {110}/<110> substrate. If the substrate 102a includes the {100}/<110> substrate, side surfaces 102bs of the active fin 102b are {110} surfaces and an upper surface 102bt thereof is a {100} surface. If the substrate 102a includes the {110}/<110> substrate, the side surfaces of the active fin 102b are {100} surfaces and the upper surface thereof is a {110} surface. The isolation layer 106 fills a space between the active fins 102b. Upper parts of the active fins 102b protrude from a surface of the isolation layer 106.

The active fin 102b may include the same material as the substrate 102a For example, the active fin 102b may be a part of the substrate 102a or the active fin 102b may be epitaxially grown from the substrate 102a using the substrate 102a as a seed layer. The active fin 102b may be referred to as an active region or a fin type active region. The substrate 102a may include a silicon (Si) substrate or a silicon germanium (SiGe) substrate. The isolation layer 106 may include silicon oxide ($SiO_2$).

Referring to FIGS. 2 to 4, the sources/drains 114a are formed at both sides of the gate structure GS, respectively. The sources/drams 114a are epitaxially formed on the side surfaces 102bs and the upper surface 102bt of the active fin 102b. For example, the source/drains 114a are epitaxially grown using the side surfaces 102bs and the upper surface 102bt of the active fin 102b as seed layers in an epitaxial process. If the substrate 102a includes a {100}/<110> substrate, the side surfaces 102bs of the active fin 102b include {110} surfaces, and the upper surface 102bt of the active fin 102b includes a {100} surface. The source/drain 114a may be epitaxially grown so that the source/drain 114a may have {110} surfaces and {111} surfaces. The source/drain 114a has crystalline surfaces covering the upper part of the active fin 102b. The source/drain 114a includes side surfaces S1 facing the side surfaces of the active fin 102b. For example, the side surfaces S1 of the source/drain 114a are in substantially parallel with the side surfaces 102bs of the active fin 102b. The source/drain 114a includes upper surfaces S2 and lower surfaces S4, which are sloped at a predetermined angle with respect to the side surfaces S1. The side surfaces S may include {110} surfaces. The upper surfaces S2 and the lower surfaces S4 may include {111} surfaces. If the substrate 102a includes a {110}/<110> substrate, the side surfaces of the active fin 102b include {100} surfaces, and the upper surface of the active fin 102b includes a {110} surface. The side surfaces S1 of the source/drain 114a may include {100} surfaces and the upper surfaces S2 and the lower surfaces S4 may include {111} surfaces.

The source/drain 114a may include silicon (Si) or silicon germanium (SiGe). For example, if the semiconductor device 100a is an N-type transistor, the source/drain 114a of the semiconductor device 100a may include a silicon (Si) crystal doped with N-type impurities. If the semiconductor device 100a is a P-type transistor, the source/drain 114a of the semiconductor device 100a may include a silicon germanium (SiGe) crystal doped with P-type impurities. For example, the silicon (Si) crystal and the silicon germanium (SiGe) crystal may be used for both N-type and P-type transistors.

Referring to FIG. 2, parts of the active fins 102b, which are surrounded by the sources/drains 114a, may be source/drain regions S/D including impurities. Substantially, the active fins 102b including the impurities and the sources/ drains 114a which surround the active fins 102b may be collectively referred to as the source/drain regions S/D. A concentration of the impurities may be increased closer to the surfaces of the sources/drains 114a.

Referring to FIG. 4, the gate structure GS which crosses the active fins 102b includes a gate electrode 120, a gate dielectric 118, and spacers 112a. The gate dielectric 118 is conformally formed along an upper surface of the isolation layer 106, and the side surfaces and the upper surface of the active fin 102b. The gate electrode 120 is in contact with a surface of the gate dielectric 118. The gate dielectric 118 covers the upper surface and the side surfaces of the active fin 102b. The gate dielectric 118 and the gate electrode 120 each may include side surfaces and an upper surface parallel to the side surfaces 102bs and the upper surface 102bt of the active fin 102b. The spacers 112a are located at one side of the gate electrode 120 and the other side facing the one side. The spacers 112a are in contact with the surface of the gate dielectric 118. In this case, residue 112b, shown in FIG. 1, are formed after the spacers 112a are formed. The residue 112b and the spacers 112a are formed of substantially the same material. The residue 112b is located along the boundary between the side surfaces of the active fin 102b and the surface of the isolation layer 106 along Y-direction. The residue 112b causes the lower surfaces S4 of the sources/drains 114a to be spaced apart from the isolation layer 106 by a height of the residue 112b. The formation of the residue 112b will be described later with reference to FIGS. 23 and 24.

The gate dielectric 118 may include a high-k dielectric material. The high-k dielectric material may include hafnium oxide ($HfO_2$), aluminum oxide ($Al_2O_3$), zirconium oxide ($ZrO_2$), or tantalum oxide ($Ta_2O_5$). The gate electrode 120 may include tungsten (W) or aluminum (Al). The spacer 112a may include a material having permittivity lower than the gate dielectric 118. For example, the spacer 112a may include silicon nitride ($SiN_x$) or silicon oxynitride ($SiO_xN_y$).

Referring to FIGS. 3 and 4, the auxiliary contact layers 115 substantially cover the side surfaces S1, the upper surfaces S2, and the lower surfaces S4 of the sources/drains 114a. The source/drain contacts 126a are in contact with the auxiliary contact layers 115. The source/drain contacts 126a pass through the interlayer insulating layer 116 and the protection layer 124. For example, the source/drain contacts 126a fill via holes VH, respectively, which are through holes formed in the protection layer 124. For example, the source/drain contacts 126a are in contact with an upper surface CS2 and side surfaces CS1 of the auxiliary contact layer 115. The source/drain contacts 126a may be referred to as a plug.

The auxiliary contact layer 115 may include a silicide layer. The silicide layer may include an alloy layer of a metal and silicon. The auxiliary contact layer 115 may include $WSi_2$, $MoSi_2$, $TiSi_2$, or $CoSi_2$. The source/drain contacts 126a are disposed on the surface of the auxiliary contact layer 115 formed along the side surfaces and the upper surfaces of the source/drain 114a. The source/drain contact 126a may be in contact with the auxiliary contact layer 115 in various forms. Hereinafter, the contact forms between the source/drain contact 126a and the auxiliary contact layer 115 will be described with reference to FIGS. 5A to 5E.

FIGS. 5A to 5E are various cross-sectional views of contact forms between a source/drain contact and an auxiliary contact layer of a semiconductor device according to an exemplary embodiment of the present inventive concept.

Figure 5A:
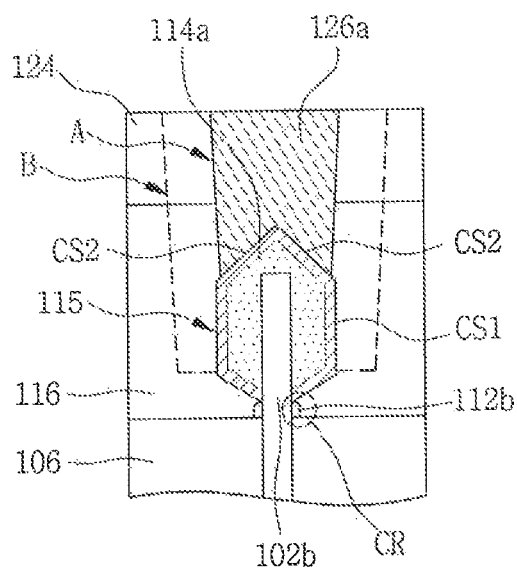
FIGS. 5A to 5E are various cross-sectional views of contact forms between a source/drain contact and an auxiliary contact layer of a semiconductor device in accordance with an exemplary embodiment of the present inventive concept.

Referring to FIG. 5A, each source/drain contact 126a is in contact with the auxiliary contact layer 115 in a symmetrical form with respect to the active fin 102b. For example, in a first contact form A of the auxiliary contact layer 115, the source/drain contact 126a is in contact with the upper surfaces CS2 of the auxiliary contact layer 115. In a second contact form B of the auxiliary contact layer 115, the source/drain contact 126a is in contact with the upper surfaces CS2 and the whole of the side surfaces CS1 of the auxiliary contact layer 115.

Figure 5B:
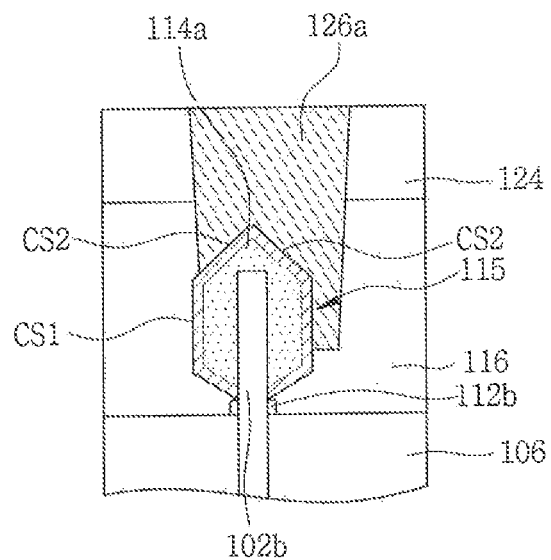

Referring to FIG. 5B, each source/drain contact 126a is in contact with the auxiliary contact layer 115 in an asymmetrical form with respect to the active fin 102b. For example, the source/drain contact 126a is in contact the upper surfaces CS2 of the auxiliary contact layer 115 and one side surface CS1 of the auxiliary contact layer 115. In this case, a part of the source/drain contact 126a is located on the upper surface of the auxiliary contact layer 115, and another part of the source/drain contact 126a is located on the one side surface CS1 of the auxiliary contact layer 115. Such contact forms may secure a distance between adjacent source/drain contacts 126a without reducing a contact area between the auxiliary contact layer 115 and the source/drain contact 126a if the source/drain contacts 126a are densely disposed.

Figure 5C:
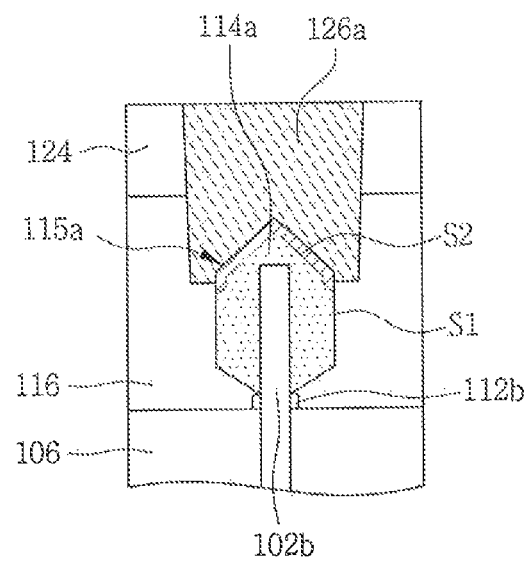

Referring to FIG. 5C, an auxiliary contact layer 115a is formed only between a lower surface of the source/drain contact 126a, and the upper surfaces S2 and upper parts of the side surfaces S1 of the source/drain 114a. In this case, the auxiliary contact layer 115a is disposed in the via hole VH in which the source/drain contact 126a is filled. For example, after the via hole VH is formed, a metal is deposited through the via hole VH. A heating process is, then, performed on the metal to form the auxiliary contact layer 115a only on a part exposed by the via hole VH. Auxiliary contact layers 115b, 115c, and 115d which will be described with reference to FIGS. 5D and 5E below may also be formed through the above-described processes.

Figure 5D:
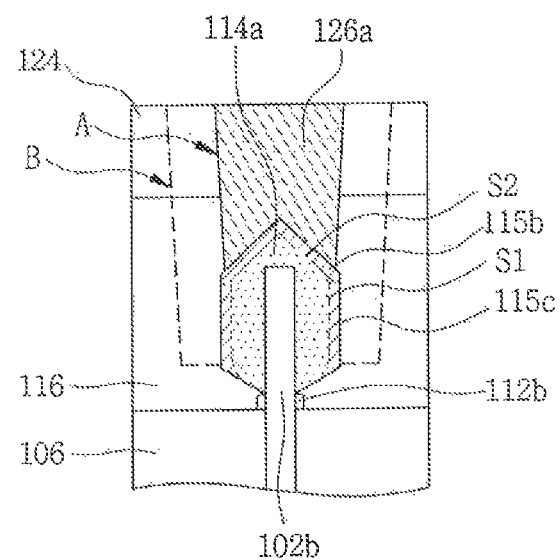

Referring to FIG. 5D, an auxiliary contact layer 115b is formed only between the source/drain contact 126a and the upper surfaces S2 of the source/drain 114a. When the source/drain contact 126a with the second contact form B described with reference to FIG. 5A is formed, the auxiliary contact layer 115c is formed only between the upper surfaces S2 and both side surfaces S1 of the source/drain 114a and the source/drain contact 126a.

Figure 5E:
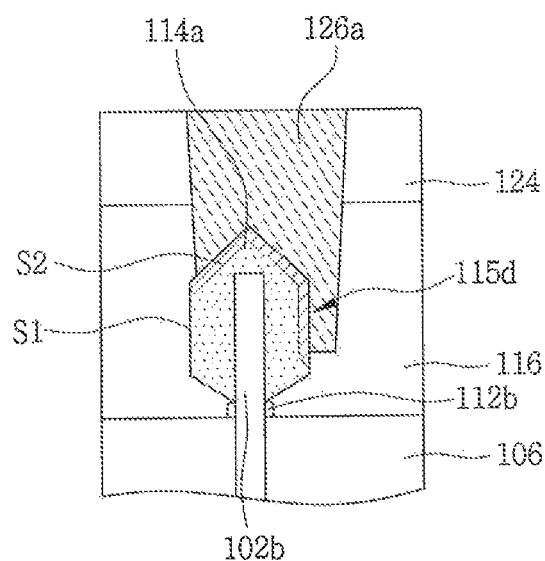

Referring to FIG. 5E, an auxiliary contact layer 115d is formed only between the upper surfaces S2 and one side surface S1 of the source/drain 114a and the source/drain contact 126a.

In the semiconductor device 100a, the residue 112b is a remaining portion of a material layer to form the spacers 112a. The residue 112b is located at edges CR formed by the side surfaces of the active fin 102b and the surface of the isolation layer 106. Alternatively, the residue 112b need not remain at the edges CR.

Figure 6:
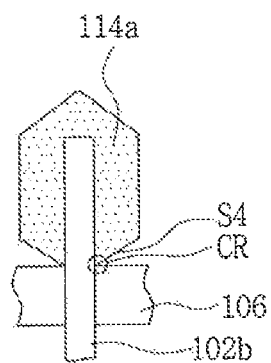
FIG. 6 is a cross-sectional view of a source/drain in a semiconductor device in accordance with an exemplary embodiment of the present inventive concept.

FIG. 6 is a cross-sectional view of a source/drain in a semiconductor device according to an exemplary embodiment of the present inventive concept. For the convenience of description, a source/drain 114a, an isolation layer 106 and an active fin 102b are shown in FIG. 6.

Referring to FIG. 6, the residue does not remain at the edges CR formed by the side surfaces of the active fin 102b and the surface of the isolation layer 106. During a crystallization process, a crystalline surface of the source/drain 14a may be grown from the active fin 102b of the edge CR formed by the side surface of the active fin 102b and the surface of the isolation layer 106. The crystalline surface S4 may be grown to have a predetermined angle with respect to the surface of the isolation layer 106.

In a semiconductor device having a residue, shown in FIG. 1, the residue is interposed between the source/drain 114a and the isolation layer 106, and thus silicon or silicon germanium is grown on the side surfaces and the upper surface of the active fin 102b.

Hereinafter, it will be described that an active fin 102b is partially recessed and a source/drain is formed on the recessed surface of the active fin 102b using crystal growth.

Figure 7:
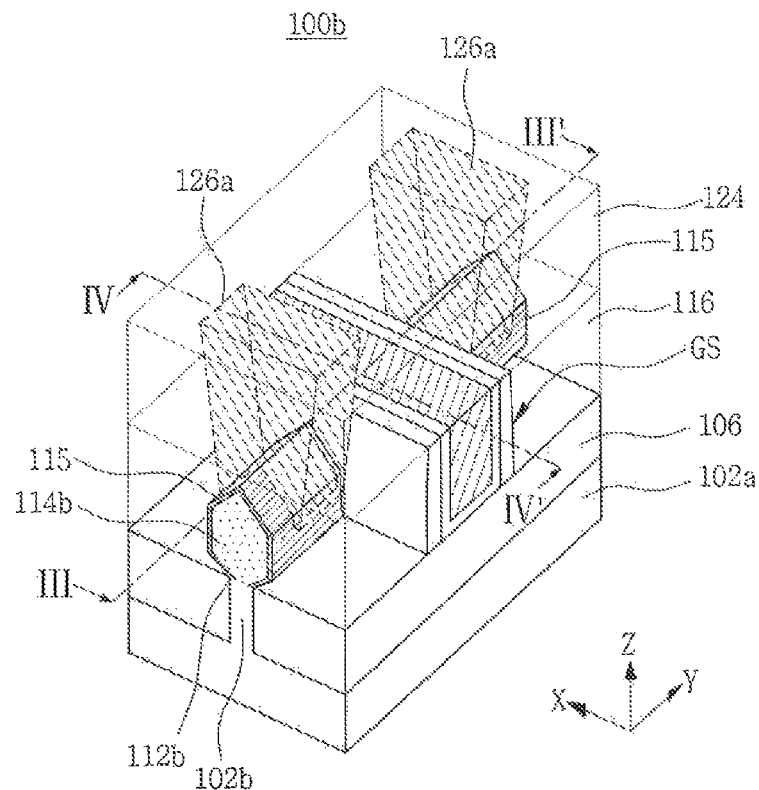
FIG. 7 is a perspective view of a semiconductor device in accordance with an exemplary embodiment of the present inventive concept.
Figure 8:
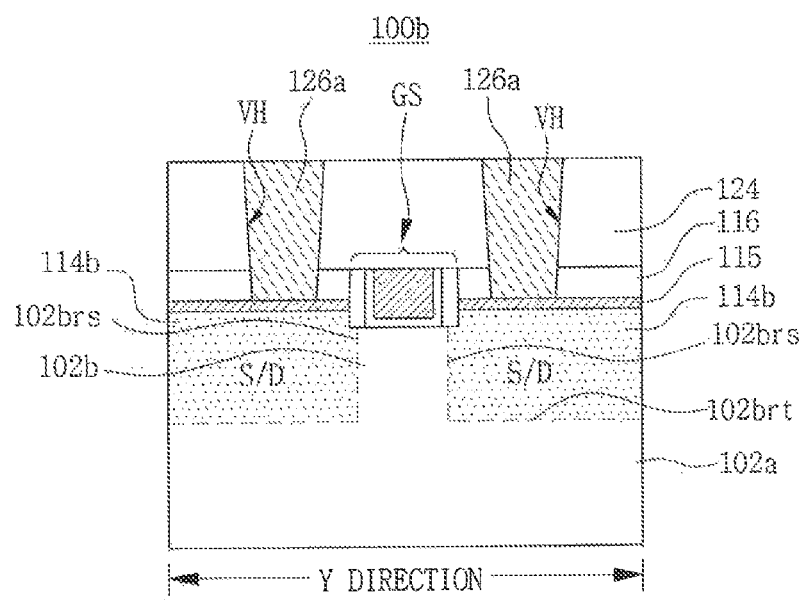
FIG. 8 is a cross-sectional view of FIG. 7, taken along line III-III' of a Y direction.
Figure 9:
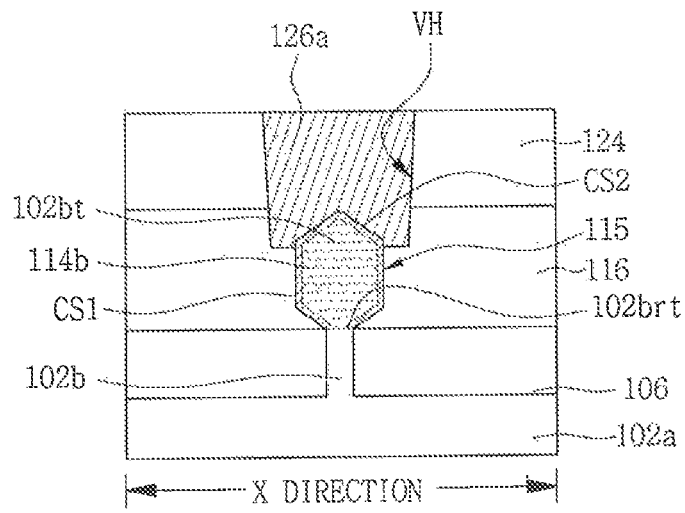
FIG. 9 is a cross-sectional view of a source/drain shown in FIG. 7, taken along line IV-IV' of an X direction.
Figure 10:
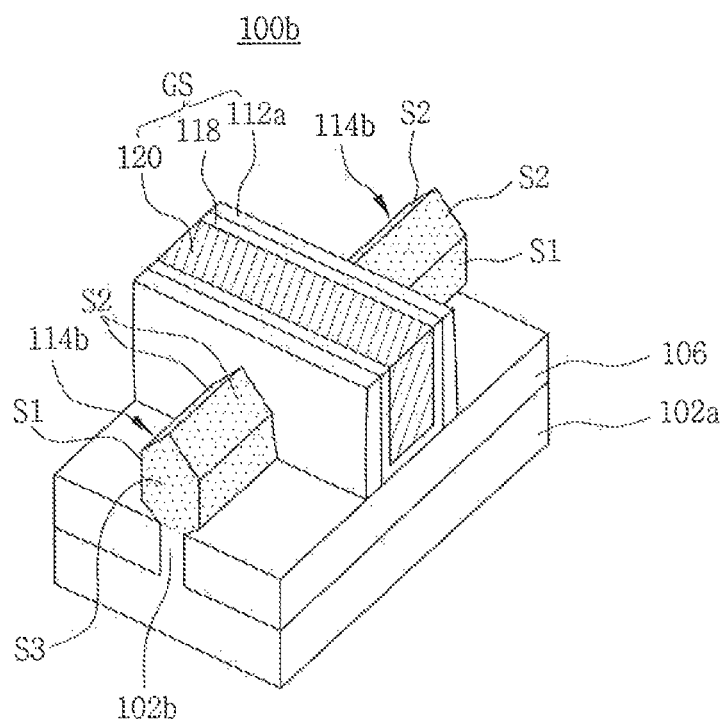
FIG. 10 is a perspective view of the semiconductor device of FIG. 7 having a source/drain exposed, in accordance with an exemplary embodiment of the present inventive concept.

FIG. 7 is a perspective view of a semiconductor device according to an exemplary embodiment of the present inventive concept. FIG. 8 is a cross-sectional view of FIG. 7, taken along line III-III' of a Y direction. FIG. 9 is a cross-sectional view of a source/drain shown in FIG. 7, taken along line IV-IV' of an X direction. FIG. 10 is a perspective view of the semiconductor device of FIG. 7 having a source/drain exposed, according to an exemplary embodiment of the present inventive concept.

Referring to FIGS. 7 to 10, the semiconductor device 100b includes a substrate 102a, an active fin 102b which protrudes from a surface of the substrate 102a, an isolation layer 106, a gate structure GS, sources/drains 114b formed by crystal growth, auxiliary contact layers 115 which surround the sources/drains 114b, and source/drain contacts 126a in contact with the auxiliary contact layers 115. In an exemplary embodiment, the active fin 102b may be part of the substrate 102a. The isolation layer 106 covers the surface of the substrate 102a and parts of side surfaces of the active fin 102b. The semiconductor device 100b further includes an interlayer insulating layer 116 which covers the isolation layer 106 and the auxiliary contact layers 115, and a protection layer 124 which covers an upper part of the interlayer insulating layer 116 and surrounds the source/drain contacts 126a.

The substrate 102a may include a silicon (Si) substrate or a silicon germanium (SiGe) substrate. The gate structure GS may include a gate dielectric 118, a gate electrode 120, and spacers 112a.

Referring to FIGS. 8, 9, and 10, the gate structure GS crosses the active fin 102b. Both sides of the active fin 102b are recessed so that a first upper surface of the active fin 102b which crosses the gate structure GS is higher than a second upper surface thereof which is a recessed surface of the active fin 102b. A recessed upper surface 102brt of the active fin 102b is located at substantially the same level with an upper surface of the isolation layer 106. Alternatively, the recessed upper surface 102brt of the active fin 102b is located higher than the upper surface of the isolation layer 106. For the convenience of description, it is assumed that the substrate 102a substrate 102a includes the {100}/<110> substrate. The recessed upper surface 102brt of the active fin 102b may include a {110} surface. Recessed side surfaces 102brs of the active fin 102b is exposed when the active fin 102b is recessed. The recessed side surfaces 102brs of the active fin 102b may also include {100} surfaces.

Referring to FIGS. 8 and 10, the sources/drains 114b are formed by crystal growth from the recessed upper surface 102brt and the recessed side surfaces 102brs of the active fin 102b. Crystalline surfaces of the sources/drains 114b may have {111} surfaces and {100} surfaces. The crystalline surfaces of the sources/drains 114b may have diamond crystal structures in which at least one cross-sectional surface has a hexagonal shape. The sources/drains 114b include first side surfaces S1 which are parallel to the active fin 102b and face each other, a second side surface S3 perpendicular to the first side surfaces S1, and upper surfaces S2 simultaneously contacting the first side surfaces S1 and the second side surface S3. The first side surfaces S1 face the side surfaces of the active fin 102b which crosses the gate structure GS. For example, the first side surfaces S1 are in substantially parallel with the side surfaces of the active fin 102b. The first side surfaces S1 and the second side surface S3 may include {100} surfaces. The upper surfaces S2 may include {111} surfaces. The second side surface S3 has a hexagonal shape.

Referring to FIGS. 9 and 10, the auxiliary contact layer 115 covers whole exposed surfaces of the source/drain 114b. The auxiliary contact layer 115 may include a silicide layer. The silicide layer may include an alloy layer of a metal and silicon including $WSi_2$, $MoSi_2$, $TiSi_2$, or $CoSi_2$.

Referring to FIGS. 8 and 9, the source/drain contacts 126a are in contact with the auxiliary contact layers 115. The source/drain contacts 126a pass through the interlayer insulating layer 116 and the protection layer 124. For example, the source/drain contacts 126a fill via holes VH, respectively, which are through-holes formed in the protection layer 124. For example, the source/drain contact 126a is in contact with upper surfaces CS2 and upper parts of the side surfaces CS1 of the auxiliary contact layer 115. The source/drain contacts 126a may contact the auxiliary contact layer 115 in various forms as described with reference to FIGS. 5A and 5B. Further, the auxiliary contact layers 115 may be formed in the forms described with reference to FIGS. 5C to 5E.

In the above-described embodiments, it was described that the side surfaces and the upper surface of the active fin 102b are formed to have a right angle. An upper part of the active fin 102b may be formed in various forms. This will be described with reference to FIGS. 11A and 11B below.

Figure 11A:
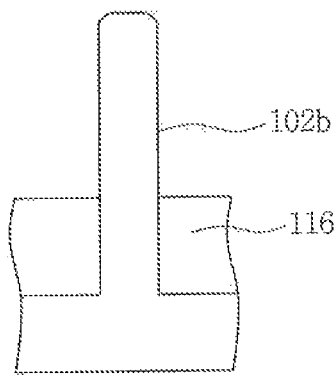
FIGS. 11A and 11B are cross-sectional views of an active fin.
Figure 11B:
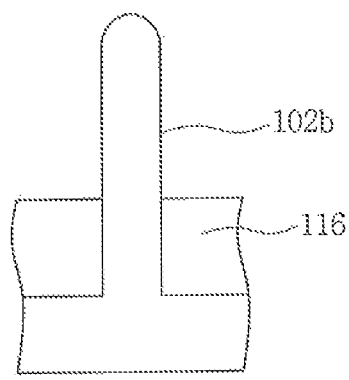

FIGS. 11A and 11B are cross-sectional views showing the active fin.

Referring to FIGS. 1, 7, 11A and 11B, the gate structure GS crosses the active fin 102b, and the gate structure GS has surfaces parallel to the side surfaces and the upper surface of the active fin 102b. In this case, edges formed by the side surfaces and the upper surface of the active fin 102b may be rounded. The round edges may provide an increased step coverage in processes of forming the gate structure GS in compared with right angle edges.

As shown in FIG. 11A, the edges formed by the upper surface and the side surfaces of the active fin 102b are rounded. Alternatively, the upper surface of the active fin 102b may be rounded as shown in FIG. 11B.

Such rounded edged or upper surfaces of the active fin 102b may suppress lateral crystal growth of the sources/drains of the semiconductor devices 100a and 100b in forming the source/drains using crystal growth. Therefore, an abnormal growth due to merged sources/drains of adjacent sources/drains at an early stage of crystal growth may be suppressed according to an exemplary embodiment. Further, in the case of a device that needs an individual driving, a distance between adjacent sources/drains may also be secured in a layout having a high degree of integration.

The semiconductor devices in accordance with the above-described embodiments of the inventive concept may be applied to peripheral devices for obtaining a high output. This will be described with reference to the drawings below.

Figure 12:
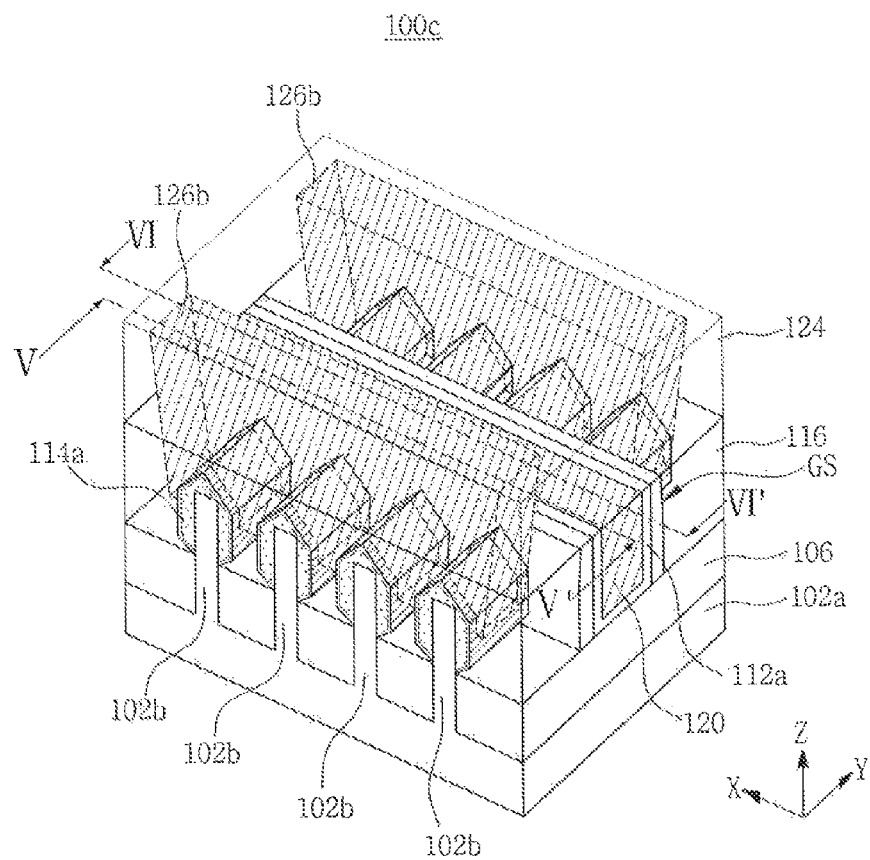
FIG. 12 is a perspective view of a semiconductor device in accordance with an exemplary embodiment of the present inventive concept.
Figure 13:
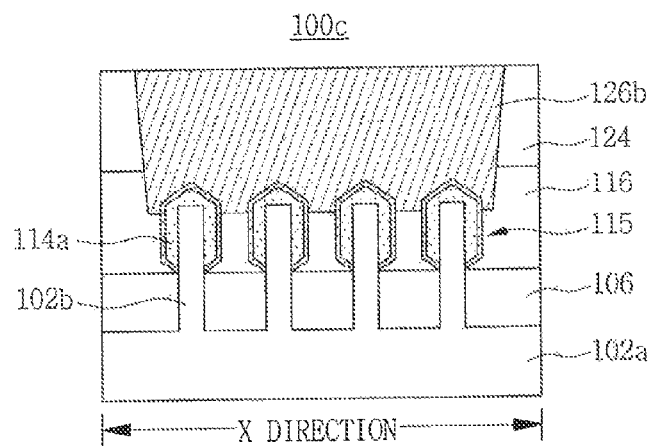
FIG. 13 is a cross-sectional view of the semiconductor of FIG. 12, taken along line V-V' of an X direction.
Figure 14:
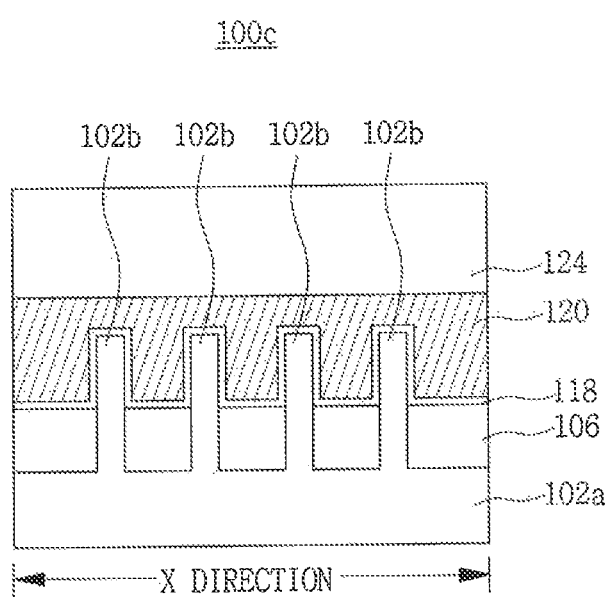
FIG. 14 is a cross-sectional view of a gate structure of FIG. 12, taken along line VI-VI' of the X direction.
Figure 15:
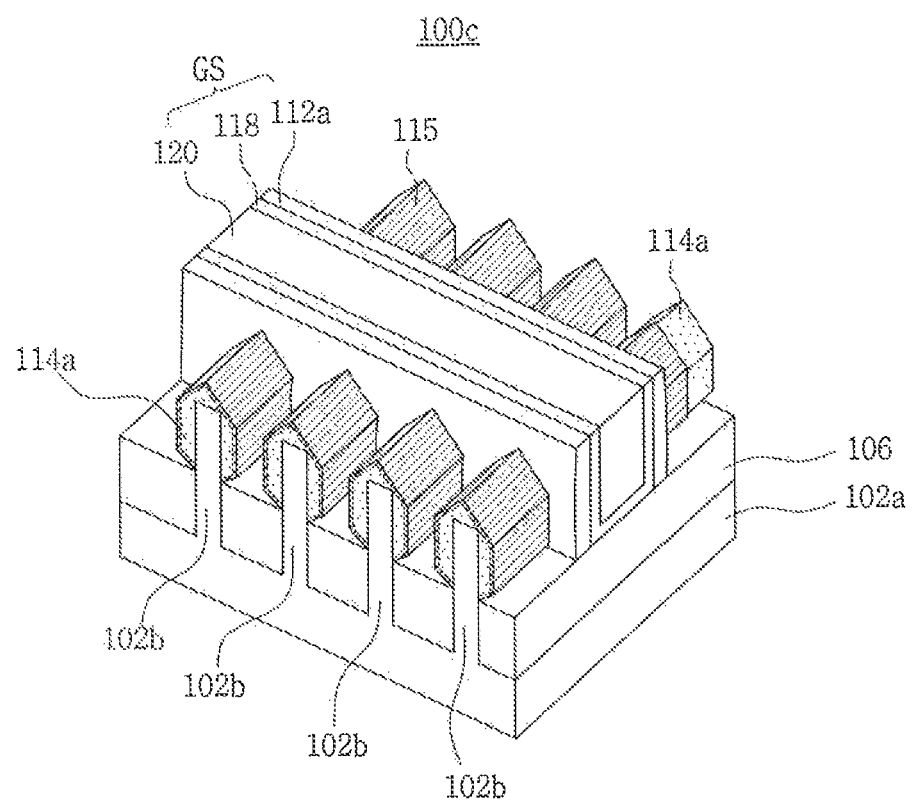
FIG. 15 is a perspective view of the semiconductor device of FIG. 12 without having source/drain contacts.

FIG. 12 is a perspective view of a semiconductor device according to an exemplary embodiment of the present inventive concept. FIG. 13 is a cross-sectional view of the semiconductor device shown in FIG. 12, taken along line V-V' in an X direction. FIG. 14 is a cross-sectional view of the semiconductor device shown in FIG. 12, taken along line VI-VI' in the X direction. FIG. 15 is a perspective view of the semiconductor device of FIG. 12 without having source/drain contacts.

Referring to FIG. 12 to 15, the semiconductor device 100c includes a substrate 102a, active fins 102b which protrude from a surface of the substrate 102a, an isolation layer 106, a gate structure GS, sources/drains 114a formed by crystal growth, auxiliary contact layers 115 which surround the sources/drains 114a, and source/drain contacts 126b which contact the auxiliary contact layers 115. In an exemplary embodiment, the active fins 102b are part of the semiconductor device 100c.

As described with reference to FIG. 1, the substrate 102a may include a {100}/<110> substrate or a {110}/<110> substrate. If the substrate 102a includes the {100}/<110> substrate, side surfaces of the active fins 102b are {110} surfaces and an upper surface thereof is a {100} surface. If the substrate 102a includes the {110}/<110> substrate, the side surfaces of the active fins 102b are {100} surfaces, and the upper surface thereof is a {110} surface.

The plurality of active fins 102b is arranged in parallel. The number of the active fins 102b may be increased as needed. The gate structure GS crosses the active fins 102b in a plan view.

Referring to FIG. 14, the gate dielectric 118 is conformally formed along an upper surface of the isolation layer 106 and the side surfaces and the upper surfaces of the active fins 102b. The gate electrode 120 is in contact with a surface of the gate dielectric 118. The gate dielectric 118 surrounds an upper surface and side surfaces of the gate electrode 120. The gate dielectric 118 and the gate electrode 120 include side surfaces and upper surfaces parallel to the side surfaces and the upper surfaces of the active fins 102b. The spacer 112a may be located at one side of the gate electrode 120 and the other side thereof facing the one side, and may contact the surface of the gate dielectric 118.

The sources/drains 114a are formed on parts of the active fins 102b which the gate structure GS does not cross. The sources/drains 114a are disposed on both sides of the gate structure GS, respectively. If the substrate 102a includes a {100}/<110> substrate, the side surfaces of the active fins 102b include {110} surfaces, and the upper surfaces of the active fins 102b include {100} surfaces. The sources/drains 114a may include {110} surfaces and {111} surfaces as described with reference to FIG. 1. Alternatively, if the substrate 102a includes a {110}/<110> substrate, the side surfaces of the active fins 102b include {100} surfaces, and the upper surfaces of the active fins 102b include {110} surfaces. The side surfaces of the sources/drains 114a may include {100} surfaces and the upper surfaces thereof may include {111} surfaces. The sources/drains 114a each may include silicon (Si) or silicon germanium (SiGe).

Referring to FIG. 13, the source/drain contact 126b may be in contact with the auxiliary contact layers 115 which surround the plurality of sources/drains 114a, respectively.

In the above-described embodiment, the sources/drains 114a are grown on the side surfaces and the upper surfaces of the active fins 102b as described with reference to FIG. 1.

Alternatively, the sources/drains 114b described with reference to FIG. 7 may be applied. This will be described with reference to FIG. 16 below.

Figure 16:
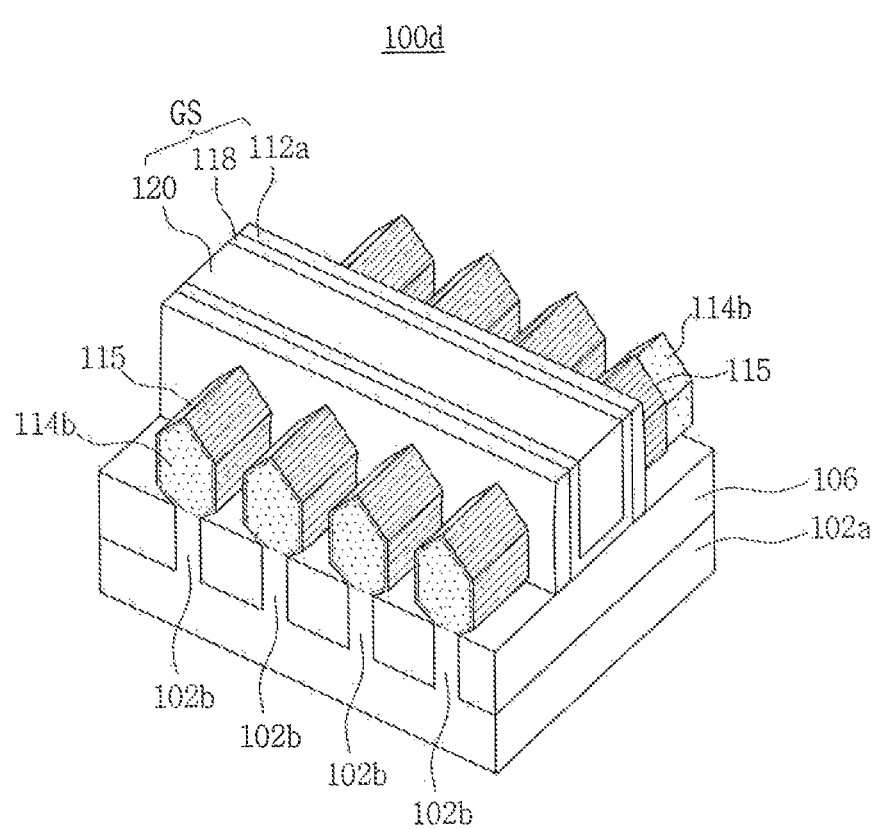
FIG. 16 is a perspective view of a semiconductor device in accordance with an exemplary embodiment of the present inventive concept.

FIG. 16 is a perspective view of a semiconductor device according to an exemplary embodiment of the present inventive concept.

Referring to FIG. 16, the active fins 102b formed using crystal growth are partially recessed so that source/drains 114b are epitaxially formed on the recessed surface of the active fins 102b. In this case, if substrate 102a may include a {110}/<110> substrate, the recessed surfaces of the active fins 102b may include {110} surfaces as described in FIG. 7. The sources/drains 114b may include {100} surfaces and {111} surfaces. Crystalline surfaces formed in a direction facing the side surfaces of the active fins 102b which cross the gate structure GS may include {100} surfaces. The upper surfaces of the active fins 102b may include {111} surfaces.

In the semiconductor devices 100d of the above-described forms, the number of the active fins 102b is increased, and thus there is an effect that a contact area of the gate dielectric 118 and the active fin 102b is increased. Therefore, current driving capability may be increased.

FIGS. 17 to 34 are cross-sectional views showing a process flow of a method of fabricating a semiconductor device according to an exemplary embodiment of the inventive concept.

Figure 17:
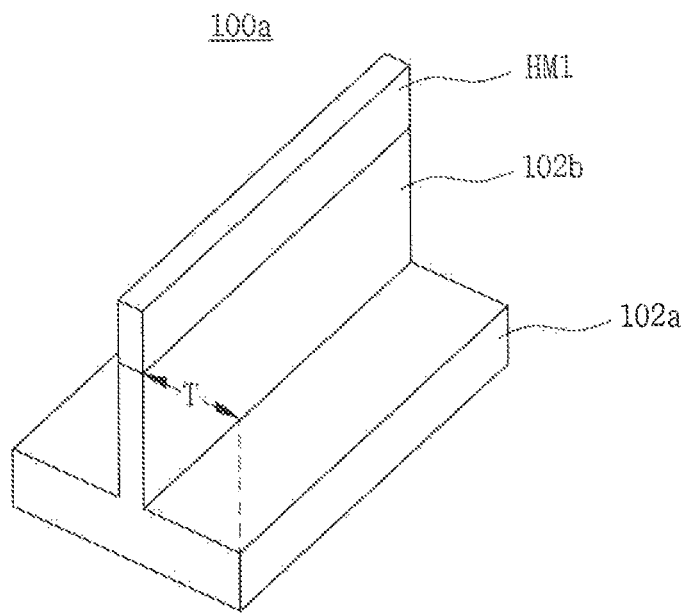
FIGS. 17 to 34 are cross-sectional views showing a process flow of a method of fabricating a semiconductor device in accordance with an exemplary embodiment of the present inventive concept.

Referring to FIG. 17, an active fin 102b which protrudes from a single substrate 102a is formed.

The forming of the active fin 102b may include forming a first hard mask pattern HM1 on a surface of the substrate 102a. Then, the forming of the active fin 102b may include recessing the surface of the substrate 102a through an etching process using the first hard mask pattern HM1 as an etch mask. When the surface of the substrate 102a is recessed, trenches T is formed. A side surface of the trench T is a side surface of the active fin 102b and a bottom surface of the trench T is the recessed surface of the substrate 102a. Therefore, the active fin 102b protrudes from the recessed surface. The active fin 102b extends in a direction. In this case, the active fin 102b is a part of the substrate 102a. For example, the active fin 102b is a protruding part of the substrate 102a. Alternatively, the active fin 102b may be epitaxially grown from a substrate.

The substrate 102a may include a {100}/<110> substrate or a {110}/<110> substrate. If the substrate 102a includes the {100}/<110> substrate, the side surfaces of the active fin 102b are {110} surfaces and the upper surface of the active fin 102b is a {100} surface. If the substrate 102a includes the {110}/<110> substrate, the side surfaces of the active fin 102b are {100} surfaces and the upper surface of the active fin 102b is a {110} surface. An end of an upper part of the active fin 102b may be formed with the forms above-described with reference to FIGS. 11A and 11B.

The substrate 102a may include a silicon (Si) substrate or a silicon germanium (SiGe) substrate. The first hard mask pattern HM1 may include a silicon oxide ($SiO_2$) layer, a silicon nitride ($SiN_x$) layer, or a silicon oxynitride ($SiO_xN_y$) layer. The first hard mask pattern HM1 may include different hard mask material layers which are sequentially stacked in some cases.

Figure 18:
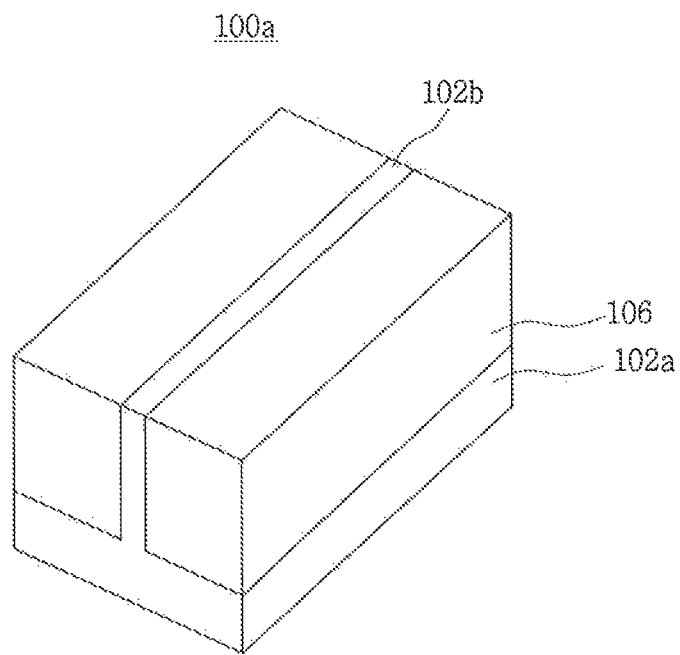

Referring to FIG. 18, an isolation layer 106 is formed in the trench T.

The isolation layer 106 fills the trenches T. The isolation layer 106 is in contact with the bottoms of the trenches T and the side surfaces of the active fin 102b. The upper surface of the isolation layer 106 and the upper surface of the active fin 102b are coplanar through a chemical mechanical polishing (CMP) process. A liner may be further formed between the isolation layer 106 and the active fin 102b. The liner may be formed on a surface of the trench T by performing an oxidation process. The isolation layer 106 may include silicon oxide ($SiO_2$).

A doped region having a high concentration may be formed under the active fin 102b. The doped region may include a P-type well or an N-type well. In the case of a P-type transistor, the N-type well may be formed by implanting N-type impurities. In the case of an N-type transistor, the P-type well may be formed by implanting P-type impurities.

Figure 19:
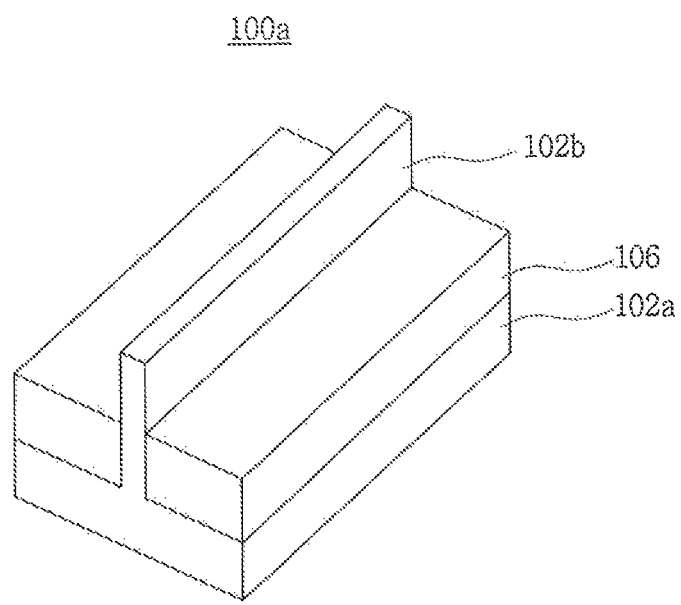
Figure 20:
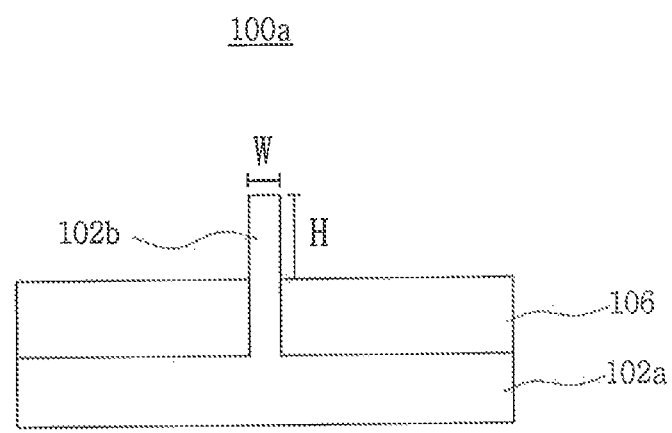

Referring to FIGS. 19 and 20, an upper part of the active fin 102b is exposed.

An upper surface of the isolation layer 106 is recessed so that the upper part of the active fin 102b is exposed. In this case, a sum of heights H of both side surfaces of the active fin 102b and a width W of the upper surface of the active fin 102b may be a channel width of the semiconductor device 100a.

Figure 21:
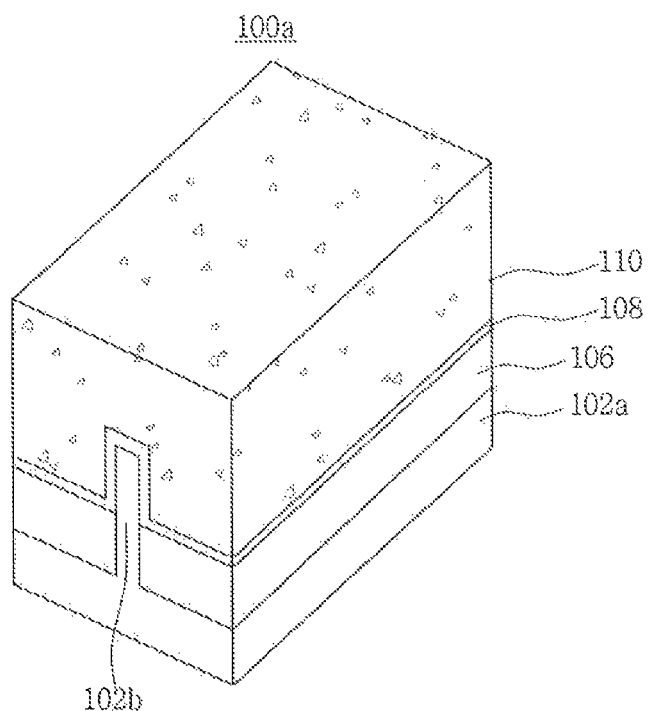
Figure 22:
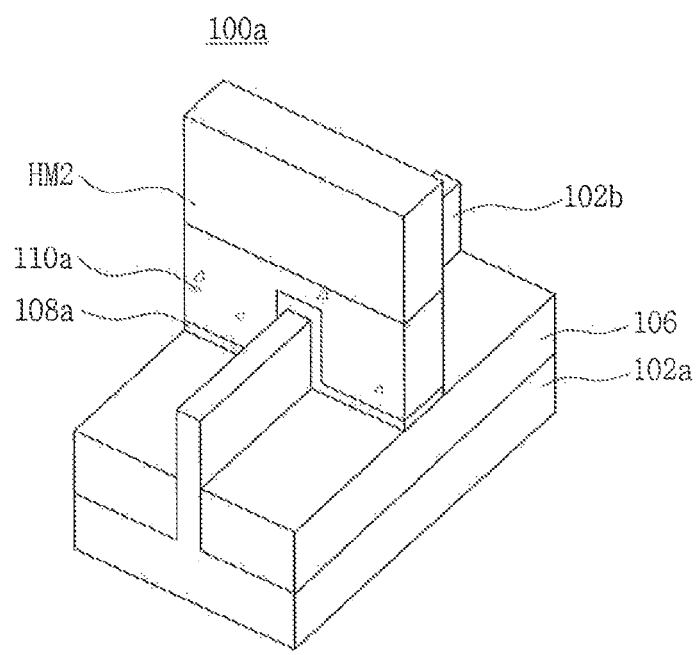

Referring to FIGS. 21 and 22, a dielectric layer 108 and a sacrificial gate layer 110 are formed, and a sacrificial dielectric layer 108a and a sacrificial gate 110a, are then formed by patterning the dielectric layer 108 and the sacrificial gate layer 110.

Referring to FIG. 21, the dielectric layer 108 and the sacrificial gate layer 110 are formed on the recessed surface of the isolation layer 106 and the exposed surfaces of the active fin 102b. The dielectric layer 108 may include a material having etch selectivity with respect to the active fin 102b. The dielectric layer 108 may include silicon nitride ($SiN_x$). The sacrificial gate layer 110 may include polysilicon.

Referring to FIG. 22, the sacrificial dielectric layer 108a and the sacrificial gate 110a are formed using a second hard mask pattern HM2 as an etch mask. The sacrificial dielectric layer 108a and the sacrificial gate 110a cross the active fin 102b. The sacrificial dielectric layer 108a and the sacrificial gate 110a have surfaces parallel to the upper surface and both side surfaces of the active fin 102b.

Alternatively, the sacrificial dielectric layer 108a may be formed by performing an oxidation process on the side surfaces and the upper surface of the active fin 102b. The sacrificial dielectric layer 108a may cover only the side surfaces and the upper surface of the active fin 102b.

Figure 23:
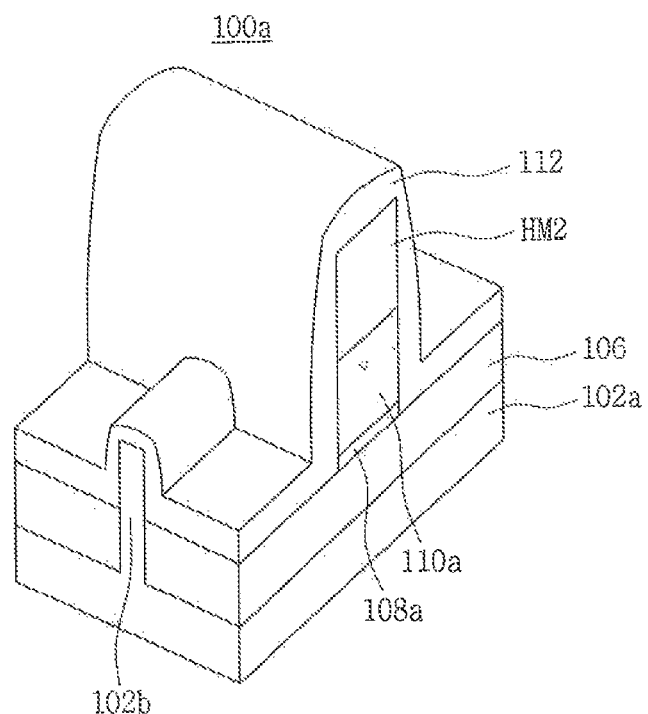
Figure 24:
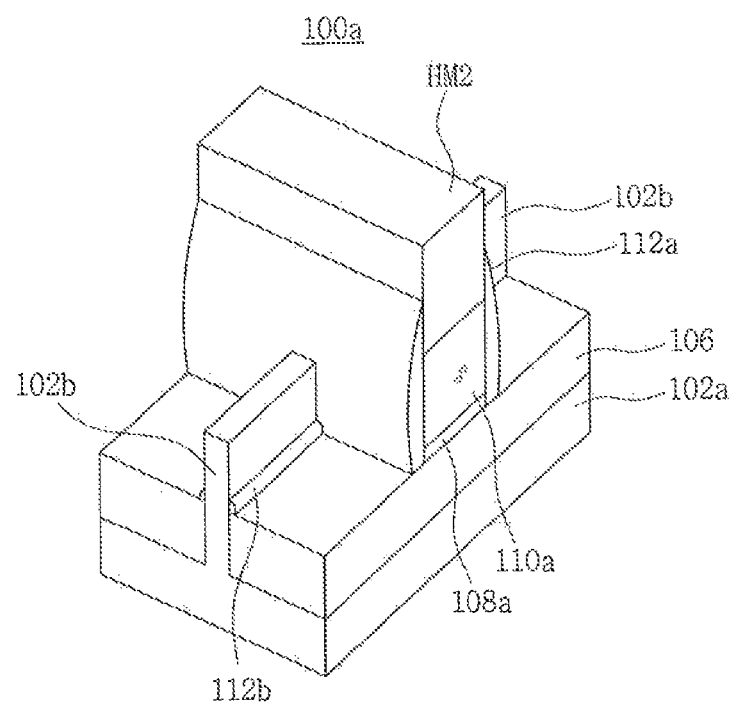

Referring to FIGS. 23 and 24, spacers 112a are formed. The spacers 112a cover side surfaces of a sacrificial gate electrode 110a and exposes the surface of the active fin 102b which is not covered by the spacers 112a and the sacrificial gate 110a.

Referring to FIG. 23, a spacer material layer 112 is conformally formed on the sacrificial gate 110a, the second hard mask pattern HM2, and the active fin 102b.

The exposing of the active fin 102b may include removing the spacer material layer 112 which covers the side surfaces of the active fin 102b. The spacer material layer 112 may be removed through an etching process having a single directionality. An upper surface and parts of side surfaces of the second hard mask pattern HM2 may be exposed while the spacer material layer 112 which covers the active fin 102b is removed. A height of the second hard mask pattern HM2 is greater than a height of the active fin 102b covered by the spacer material layer 112. Here, residue 112b of the spacer material layer 112 remains at edges formed by the surface of the isolation layer 106 and the exposed side surfaces of the active fin 102b in the etching process of forming the spacers 112a.

The spacer material layer 112 may include a low-k dielectric material. The spacer material layer 112 may include a material having etch selectivity with respect to the isolation layer 106. The spacer material layer 112 may include silicon nitride ($SiN_x$) or silicon oxynitride ($SiO_xN_y$).

Figure 25:
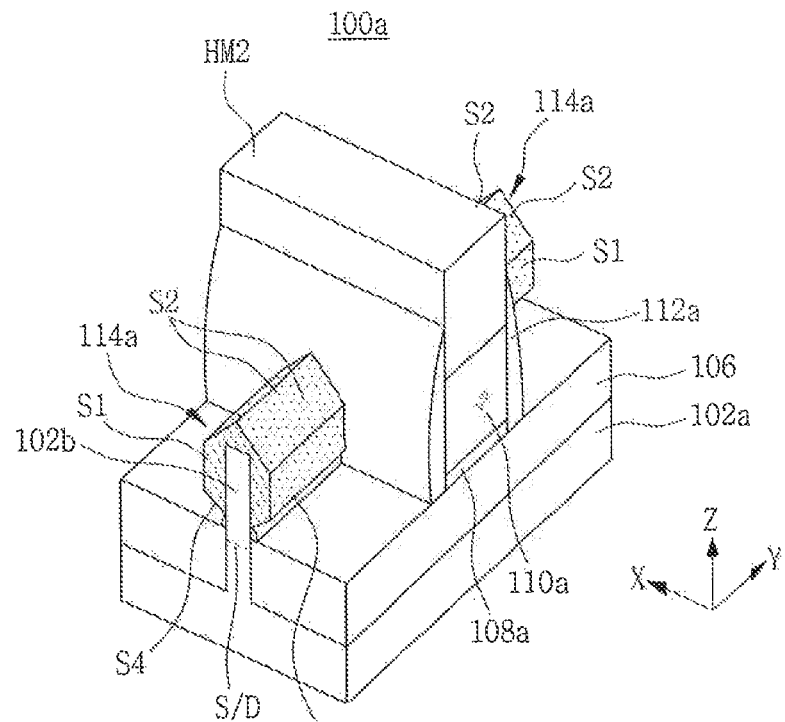
Figure 26:
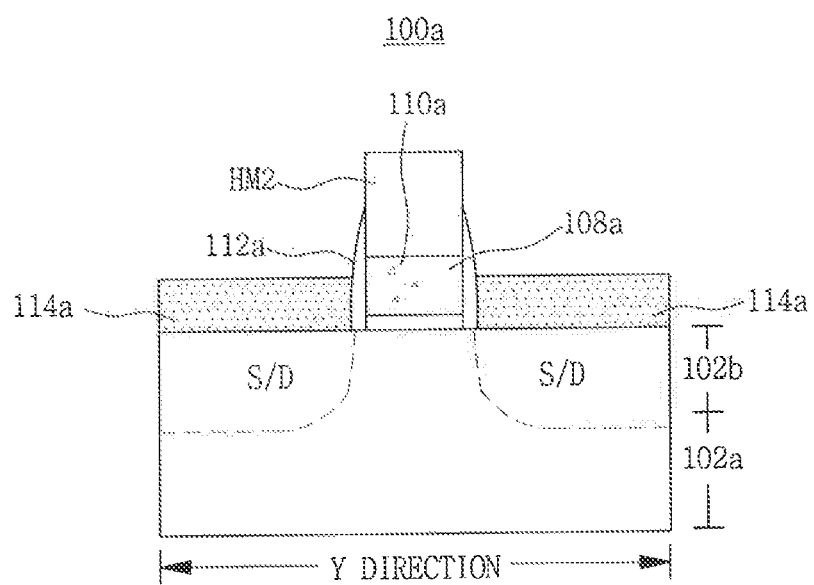

Referring to FIGS. 25 and 26, sources/drains 114a are formed by crystal growth on exposed parts of the active fin 102b at both sides of the dummy gate electrode 120, respectively.

The forming of the sources/drains 114a by crystal growth may include performing an epitaxial process on exposed parts of the active fin 102b at both sides of the spacer 112a. Crystallization may occur during the epitaxial process. The side surfaces and the upper surface of the active fin 102b exposed by the spacer 112a may serve as a seed for the crystallization.

In this case, when the source/drain 114a is formed on a {100}/<100> substrate and an epitaxial process is performed on the active fin 102b having a {110} side surface and a {100} top surface, the side surfaces of the active fin 102b having the {110} surfaces and the upper surface of the active fin 102b having the {100} surface may serve as a seed for the epitaxial process. The source/drain 114a may be formed in a diamond shape by crystal growth. The height of the active fin 102b covered by the sacrificial gate 110a may be greater than a height of the source/drain 114a.

The sources/drains 114a includes side surfaces S1 parallel to the side surfaces of the active fin 102b and upper surfaces S2 having a predetermined angle with respect to the side surfaces S1. The side surfaces S1 of the sources/drains 114a may include {110} surfaces and the upper surfaces S2 thereof may include {111} surfaces. As described above, a crystal form of the sources/drains 114a may have the side surfaces S1 located in a direction facing the side surfaces of the active fin 102b so that two adjacent source/drains 114a are positioned closer without being in contact with each other. For example, the side surfaces S1 of the source/drains 114a are in substantially parallel with the side surfaces of the active fin 102b.

Further, if an epitaxial process is performed on the active fin 102b which is formed on a {110}/<110> substrate and of which the side surfaces include {100} surfaces and the upper surface includes a {110} surface, the side surfaces of the active fin 102b including {100} surfaces and the upper surface of the active fin 102b including a {110} surface may serve as a seed layer for the epitaxial process. In this case, the crystallized sources/drains 114a may include {111} upper surfaces and {100} side surfaces.

The sources/drains 114a may include silicon (Si) or silicon germanium (SiGe). The sources/drains 114a may include impurities. If the semiconductor device 100a is an N-type transistor, the sources/drains 114a may include N-type impurities. If the semiconductor device 100a is a P-type transistor, the sources/drains 114a may include P-type impurities. The same type of impurities as the source/drain 114a may have already been implanted in the active fin 102b surrounded by the source/drain 114a. Therefore, referring to FIG. 26, source/drain regions S/D including the impurities which are implanted in the sources/drains 114a and the active fin 102b thereunder may be formed. The impurities may be differently distributed in the source/drain 114a. For example, crystal growth may be performed by increasing a doping concentration around the active fin 102b.

Figure 27:
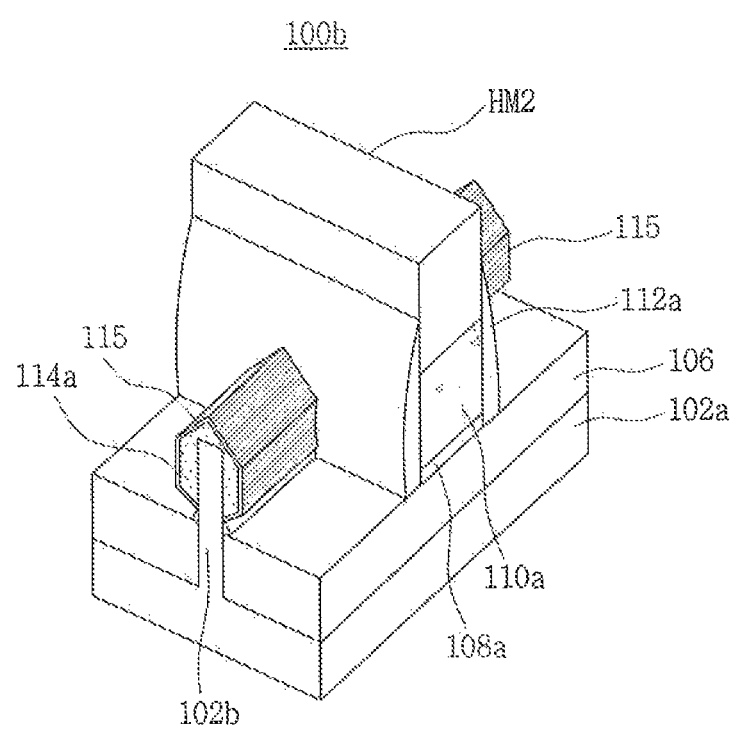

Referring to FIG. 27, auxiliary contact layers 115 are formed on the surfaces of the sources/drains 114a.

The auxiliary contact layers 115 may include a silicide layer. For example, the silicide layer may be formed by performing a heat treatment after a conductive metal layer is formed on the surfaces of the sources/drains 114a. A method of forming the conductive metal layer may include an atomic layer deposition (ALD) method. When the conductive metal layer may include tungsten (W), titanium (Ti), cobalt (Co), or the like, the silicide layer may include $WSi_2$, $MoSi_2$, $TiSi_2$, or $CoSi_2$. In the heat treatment, the lower portion of the metal layer may be converted to the silicide layer, and the upper portion of the metal layer remain unreacted. The silicide layer may be in contact with upper parts of the sources/drains 114a. In an exemplary embodiment, the unreacted metal layer may be removed using a wet etching process having etch selectivity with respect to the silicide layer.

In this case, when the sources/drains 114a includes silicon germanium (SiGe), the method may further include depositing the metal layer on the silicon layer after the silicon layer is grown to a predetermined thickness on the surfaces of the sources/drains 114a. Alternatively, in some cases, the method may include growing a crystal by changing a concentration of the silicon germanium (SiGe).

Figure 28:
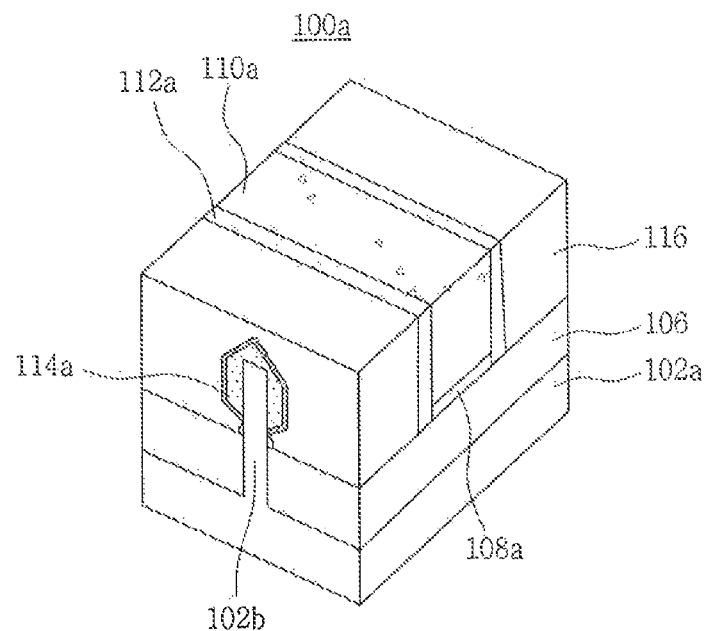
Figure 29:
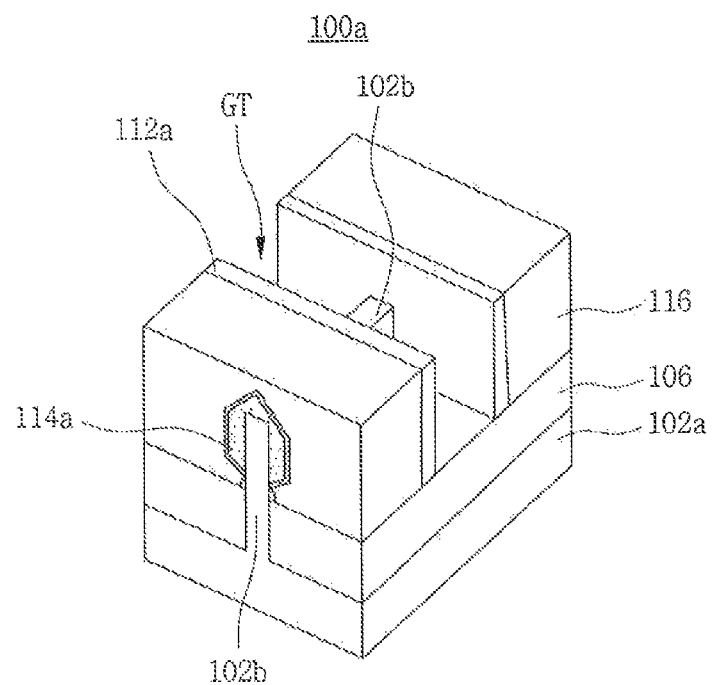
Figure 30:
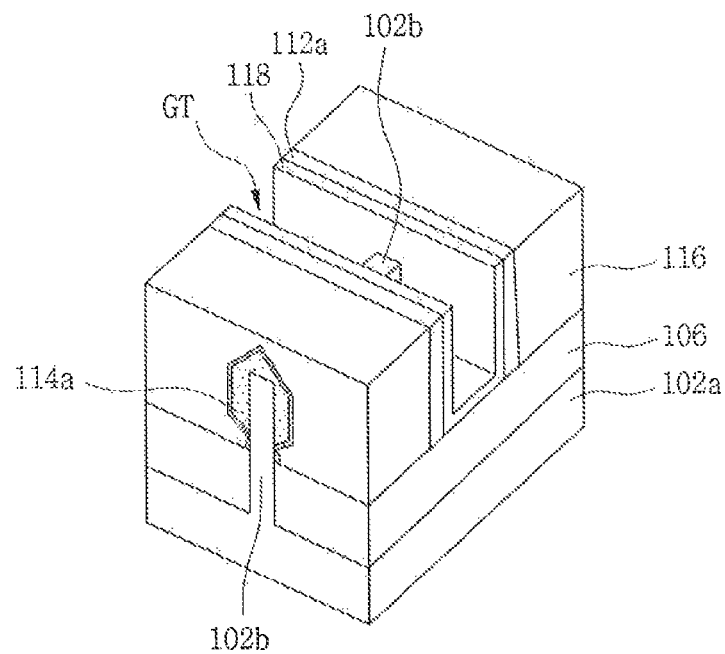

Referring to FIGS. 28 and 29, an interlayer insulating layer 116 is formed, covering the sources/drains 114a on which the auxiliary contact layers 115 are formed. The second hard mask pattern HM2 is removed to form a gate trench GT.

A surface of the sacrificial gate 110a is exposed by removing the second hard mask pattern HM2. The surface of the sacrificial gate 110a, a surface of the spacer 112a, and a surface of the interlayer insulating layer 116 may be coplanar. Alternatively, the surface of the sacrificial gate 110a, the surface of the spacer 112a, and the surface of the interlayer insulating layer 116 may be formed to have different levels. The interlayer insulating layer 116 may include silicon oxide ($SiO_2$).

The gate trench GT is formed by removing the sacrificial gate 110a and the sacrificial dielectric layer 108a. The active fin 102b underneath the sacrificial gate 110a is exposed through the gate trench GT. The sacrificial dielectric layer 108a may serve to prevent damage on the active fin 102b underneath the sacrificial dielectric layer 108a in the removal of the sacrificial gate 110a. Therefore, the sacrificial gate 110a and the sacrificial dielectric layer 108a are sequentially removed.

Figure 31:
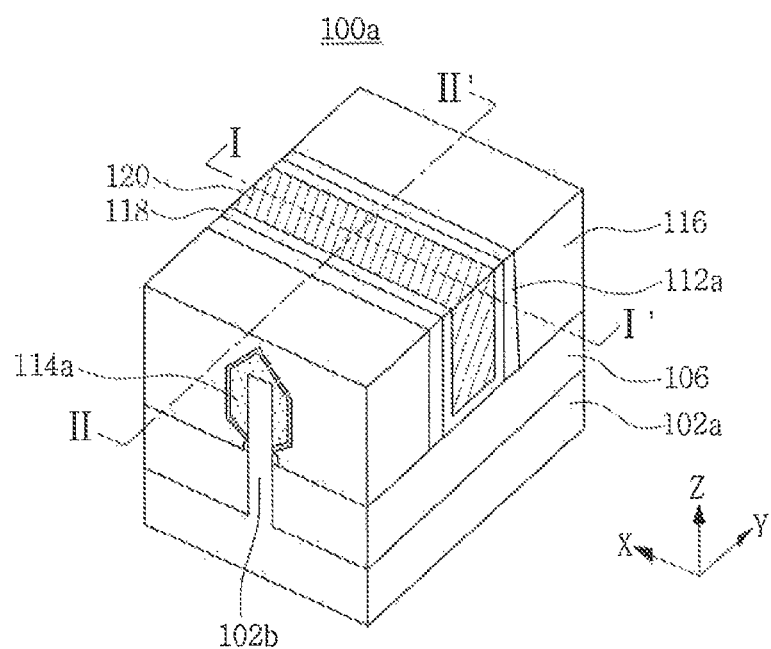
Figure 32:
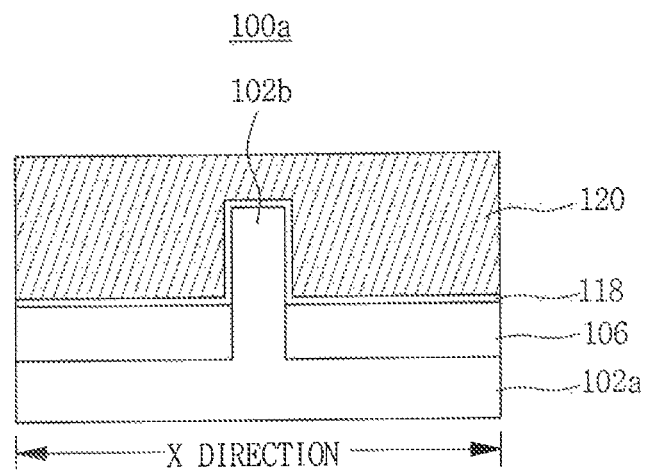
Figure 33:
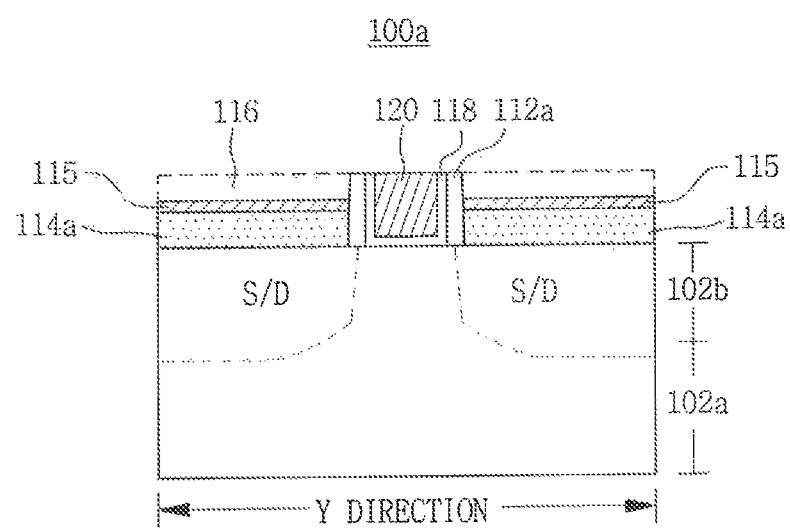

FIG. 32 is a cross-sectional view of the semiconductor device shown in FIG. 31, taken along line I-I' of an X direction. FIG. 33 is a cross-sectional view of the semiconductor device shown in FIG. 31, taken along line II-II' of a Y direction.

Referring to FIGS. 30 to 33, a gate dielectric 118 and a gate electrode 120 are formed in the gate trench GT.

The gate dielectric 118 is conformally formed in the gate trench GT and on surfaces of the active fin 102b exposed through the gate trench GT. The gate electrode 120 is in contact with the surfaces of the gate dielectric 118 to fill the gate trench GT. The gate dielectric 118 and the gate electrode 120 include surfaces parallel to the surfaces of the active fin 102b. The upper surfaces of the gate dielectric 118, the gate electrode 120, and the interlayer insulating layer 116 are coplanar.

The gate dielectric 118 may include a high-k dielectric material. The high-k dielectric material is used for the gate dielectric 118 to reduce leakage current. The high-k dielectric material may include hafnium oxide ($HfO_2$), aluminum ($Al_2O_3$), zirconium oxide ($ZrO_2$), or tantalum oxide ($Ta_2O_5$). The gate electrode 120 may include tungsten (W) or aluminum (Al).

A buffer layer may be further included between the gate dielectric 118 and the gate electrode 120. The buffer layer may include titanium nitride (TiN), tantalum nitride (TaN), etc.

Figure 34:
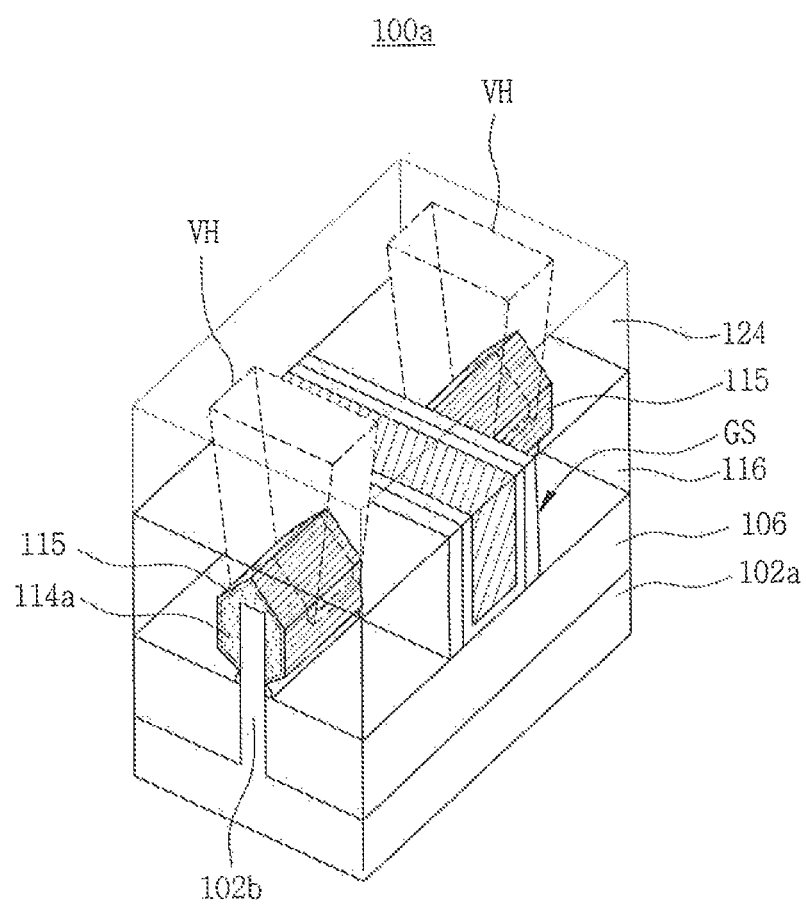

Referring to FIG. 34, a protection layer 124 which covers the exposed gate electrode 120 and via holes VH which pass through the protection layer 124 and the interlayer insulating layer 116 are formed.

The protection layer 124 covers the surface of the interlayer insulating layer 116. The protection layer 124 also covers the surface of the gate structure GS. The via holes VH pass through the interlayer insulating layer 116 and the protection layer 124. An upper surface of the via hole VH may have a rod shape which extends in one direction. The surfaces of the auxiliary contact layers 115 are exposed through the via holes VH. As above-described in FIGS. 3 and 5A, the via holes VH expose contact areas of the auxiliary contact layers 115 in a symmetrical form with respect to the active fin 102b. Alternatively, as above-described in FIG. 5B, the via holes VH expose the contact areas of the auxiliary contact layers 115 in an asymmetrical form with respect to the active fin 102b. In the formation of the via holes VH, the auxiliary contact layers 115 exposed by the via holes VH may remain unetched. Alternatively, the auxiliary contact layers 115 may be formed through the via holes VH on the source/drains 114a. For example, the auxiliary contact layers 115 may be confined within the via holes VH, as shown in FIGS. 5C to 5E, for example. Further, impurities may be implanted on the surfaces of the auxiliary contact layers 115 exposed through the via holes VH. The protection layer 124 may include silicon oxide ($SiO_2$).

Referring back to FIG. 1, source/drain contacts 126a are formed to be in contact with the auxiliary contact layers 115. The source/drain contacts 126a each may include tungsten (W).

FIGS. 35 to 40 are cross-sectional views showing a process flow of a method of fabricating a semiconductor device according to an exemplary embodiment of the present inventive concept.

Since the previous processes of processes to be described below are the same as the processes described with reference to FIGS. 17 to 23, these will be omitted.

Figure 35:
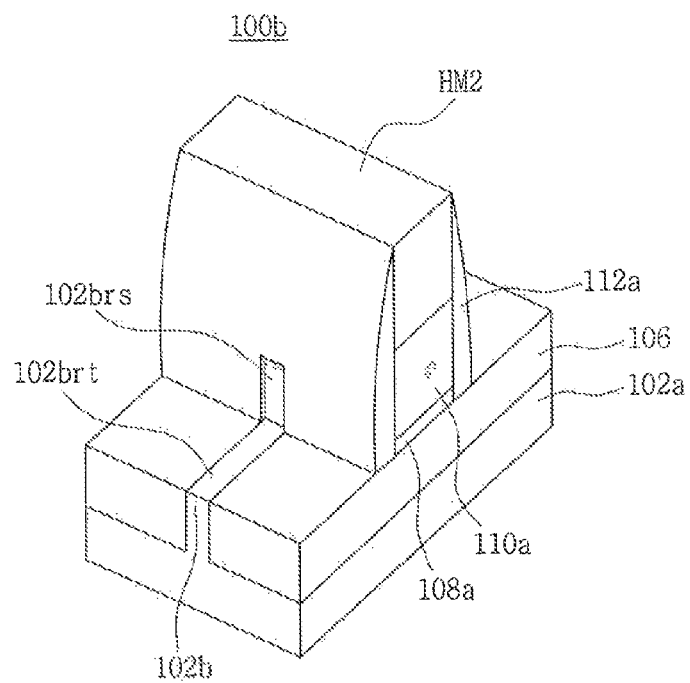
FIGS. 35 to 40 are cross-sectional views showing a process flow of a method of fabricating a semiconductor device in accordance with an exemplary embodiment of the present inventive concept.

Referring to FIG. 35, spacers 112a are formed, and an active fin 102b which does not cross a sacrificial gate 110a is recessed.

Referring to FIG. 23, the active fin 102b located at both sides of the sacrificial gate 110a may be removed while the spacers 112a are formed by removing the spacer material layer 112. When the active fin 102b located at both sides of the sacrificial gate 110a is recessed, the active fin 102b may include recessed upper surfaces 102brt and recessed side surfaces 102brs. Therefore, a first upper surface of the active fin 102b which crosses the gate structure GS may be formed to have a level higher than a second upper surface 102brt which is the recessed surface of the active fin 102b.

The recessing of the active fin 102b may include removing the spacer material layer 112 which cover the active fin 102b. The recessed upper surfaces 102brt of the active fin 102b and an upper surface of the isolation layer 106 may be coplanar. The recessed upper surfaces 102brt of the active fin 102b may include {110} surfaces, and the recessed side surfaces 102brs may include {110} surfaces. The substrate 102a may include a {110}/<110> substrate. The spacers 112a may cover side surfaces of the second hard mask pattern HM2 and side surfaces of the sacrificial gate 110a.

Figure 36:
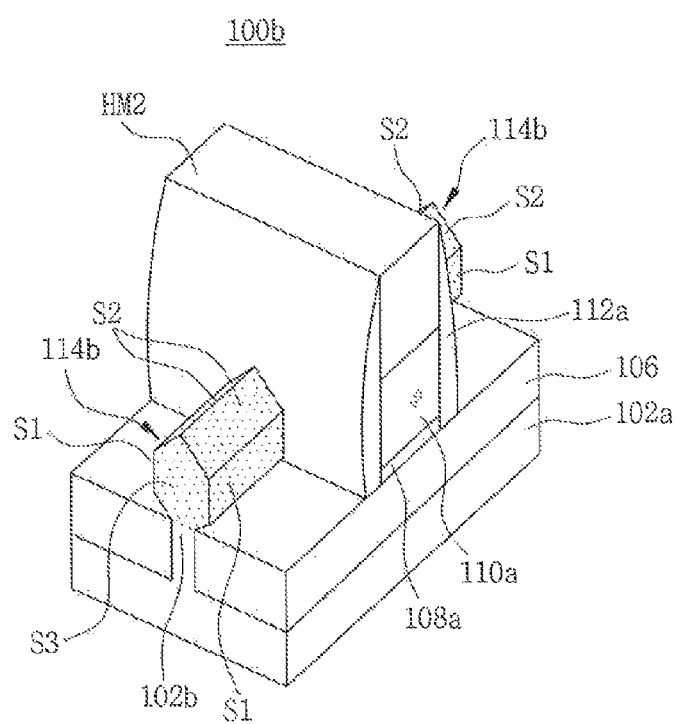

Referring to FIGS. 35 and 36, sources/drains 114b are formed by crystal growth using an epitaxial process on the recessed upper surfaces 102brt of the active fin 102b. For example, the sources/drains 114b are grown from the recessed upper surfaces 102brt of the active fin 102b and the recessed side surfaces 102brs of the active fin 102b.

The source/drain 114b has a crystal structure in a diamond shape. The source/drain 114b includes first side surfaces S1 parallel to the side surfaces of the active fin 102b, second side surface S3 perpendicular to the first side surfaces S1, and upper surfaces S2. If the substrate 102a includes {110}/<110>, the first side surfaces S1 and the second side surface S3 may include {100} surfaces. The upper surfaces S2 may include {111} surfaces. The first side surfaces S1 are located in a direction facing the side surfaces of the active fin 102b which cross the sacrificial gate 110a. The sources/drains 114b each may include silicon (Si) or silicon germanium (SiGe The source/drain 114b may include impurities. If the semiconductor device 100b includes an N-type transistor, the source/drain 114b may include N-type impurities. Referring back to FIG. 8, the sources/drains 114b may be part of source/drain regions S/D including impurities. The source/drain region S/D may extend to the active fin 102b under the source/drain 114b. The impurities may be non-uniformly distributed in the source/drain 114b. For example, crystal growth may be performed by increasing a doping concentration around the recessed surfaces of the active fin 102b.

Figure 37:
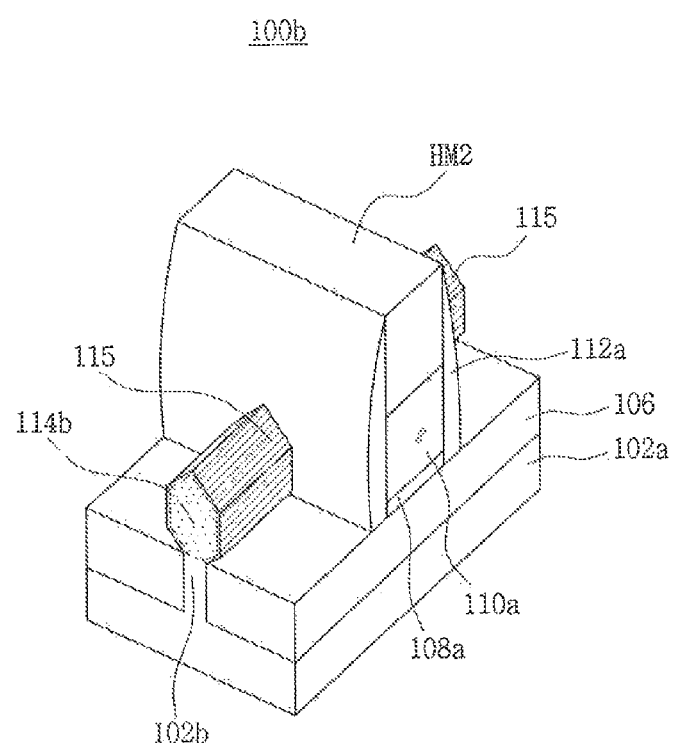

Referring to FIG. 37, auxiliary contact layers 115 are formed on the surfaces of the sources/drains 114b. The auxiliary contact layer 115 may include a silicide layer. For example, the silicide layer may be formed by performing a heat treatment after a conductive metal layer is formed on the surfaces of the source/drain 114b. A method of forming the conductive metal layer may include an ALD method. When the conductive metal layer may include tungsten (W), titanium (Ti), cobalt (Co), or the like, the silicide layer may include $WSi_2$, $MoSi_2$, $TiSi_2$, or $CoSi_2$. In the heat treatment, an upper part of the metal layer may remain unreacted on an upper surface of the second hard mask pattern HM2, surfaces of the spacers 112a, and the surface of the isolation layer 106. A lower part of the metal layer (the auxiliary contact layer 115) may be converted to the silicide layer. The silicide layer may be in contact with the source/drains 114b. In an exemplary embodiment, a wet etching process may be performed to remove the unreacted metal layer. The wet etching process may have etching selectivity of the metal layer with respect to the silicide layer.

In this case, when the source/drain 114b includes silicon germanium (SiGe), the method may further include depositing the metal layer on the silicon layer and performing a silicidation process after the silicon layer is grown to a predetermined thickness on the surfaces of the source/drain 114b. Alternatively, in some cases, the method may include growing a crystal by changing a concentration of the silicon germanium (SiGe).

Figure 38:
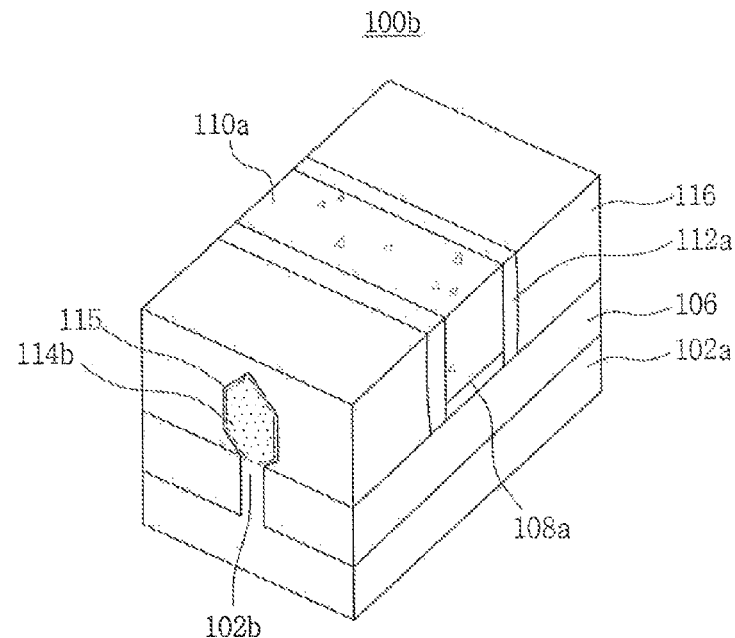
Figure 39:
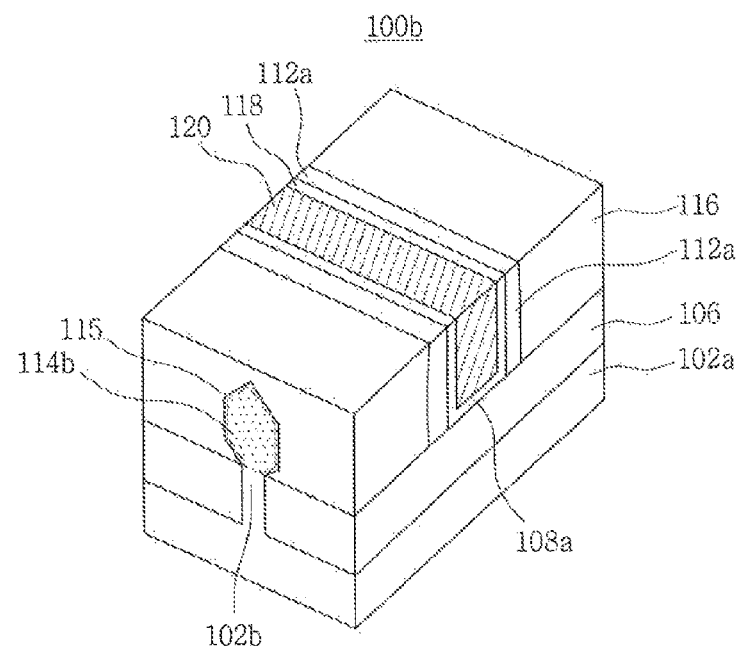

Referring to FIGS. 38 and 39, an interlayer insulating layer 116 which covers the auxiliary contact layers 115 are formed, and the second hard mask pattern HM2, the sacrificial gate 110a and the sacrificial dielectric layer 108a are removed to form a gate dielectric 118 and a gate electrode 120.

The interlayer insulating layer 116 covers the auxiliary contact layers 115. Referring back to FIGS. 29 to 31, the gate dielectric 118 and the gate electrode 120 are formed in a gate trench GT formed by removing the sacrificial gate 110a and the sacrificial dielectric layer 108a. The gate dielectric 118 and the gate electrode 120 have surfaces parallel to the facing side surfaces and the upper surface of the active fin 102b in the gate trench GT.

Figure 40:
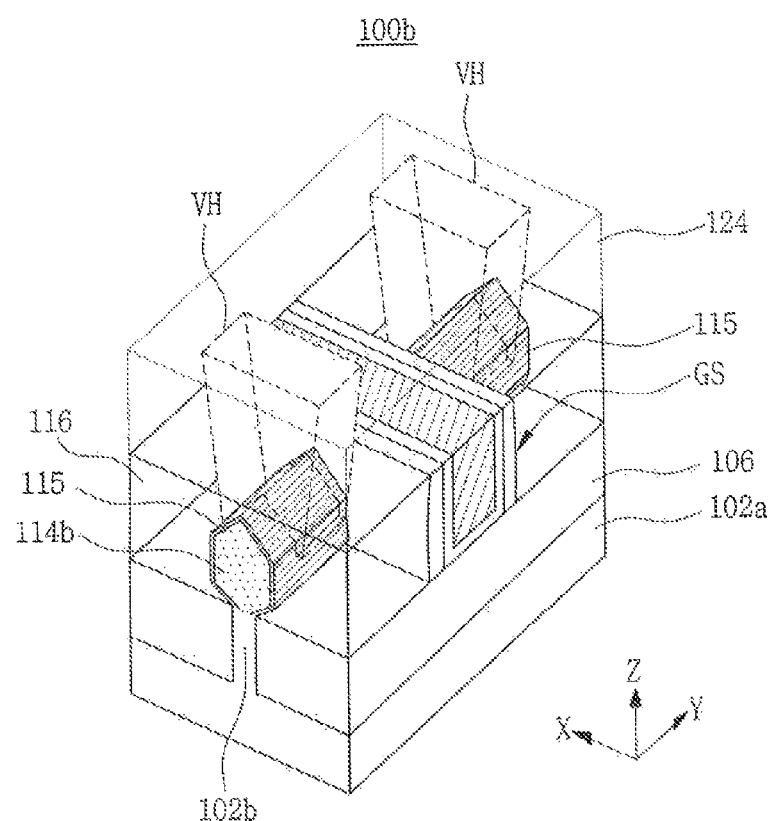

Referring to FIG. 40, a protection layer 124 is formed to cover the exposed gate electrode 120, and via holes VH are formed in the protection layer 124.

The protection layer 124 covers the surface of the interlayer insulating layer 116. The protection layer 124 covers the surface of the gate structure GS. The via holes VH pass through the interlayer insulating layer 116 and the protection layer 124. An upper surface of the via hole VH may have a rod shape which extends in one direction. The surfaces of the auxiliary contact layers 115 are exposed through the via holes VH. As above-described in FIGS. 3 and 5A, the via holes VH may expose contact areas of the auxiliary contact layers 115 in a symmetrical form with respect to the active fin 102b. Alternatively, as above-described in FIG. 5B, the via holes VH expose the contact areas of the auxiliary contact layers 115 in an asymmetrical form with respect to the active fin 102b. In the formation of the via holes VH, the auxiliary contact layers 115 thereunder may remain unetched. Alternatively, the auxiliary contact layers 115 may be formed through the via holes VH on the source/drains 114b. For example, the auxiliary contact layer 115 may be confined within the via holes VH, as shown in FIGS. 5C to 5E, for example. Further, impurities may be implanted on the surfaces of the auxiliary contact layers 115 exposed through the via holes VH. The protection layer 124 may include silicon oxide ($SiO_2$).

Hereinafter, referring back to FIG. 7, source/drain contacts 126a are formed to be in contact with the auxiliary contact layers 115. The source/drain contact 126a may include tungsten (W).

The semiconductor device 100b may be fabricated through the above-described processes. The semiconductor device 100c above-described in FIG. 12 may also be formed by applying the processes of fabricating the semiconductor device described with reference to FIGS. 17 to 34. Further, the semiconductor device 100d above-described in FIG. 16 may also be formed by applying the processes of fabricating the semiconductor device described with reference to FIGS. 35 to 40.

A semiconductor device according to an exemplary embodiment may be applied to various fields. For example, the semiconductor devices formed as described above may be applied to a logic device or a memory device.

For example, an N-type transistor and a P-type transistor of a complementary metal oxide semiconductor (CMOS) used for the logic device have the same configuration as the above-described semiconductor device. However, to be used as the P-type transistor, the active fins 102b and the source/drain crystal include P-type impurities. On the other hand, to be used as the N-type transistor, the active fins 102b and the source/drain 14b include N-type impurities. For example, a P-type transistor having a source/drain according to an exemplary embodiment may have increased current driving capability.

If a semiconductor device according to an exemplary embodiment is used for a memory device, for example, a static random access memory (SRAM). The SRAM having a semiconductor device according to an exemplary embodiment will be described with reference to FIGS. 41, 42, and 43 below.

Figure 41:
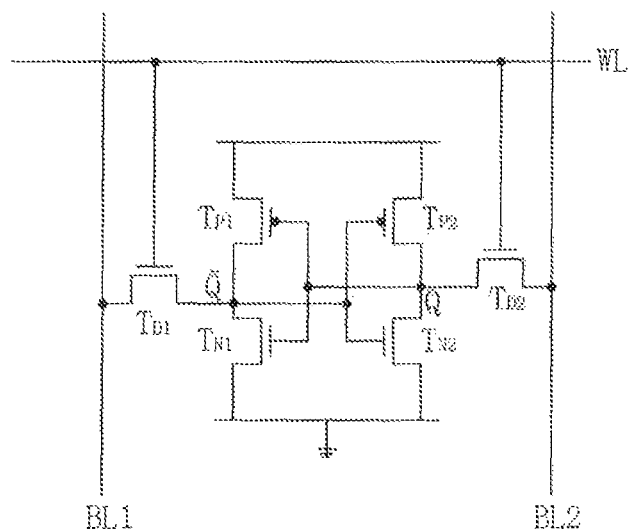
FIG. 41 is an equivalent circuit diagram of a memory device in accordance with an exemplary embodiment of the present inventive concept.
Figure 42:
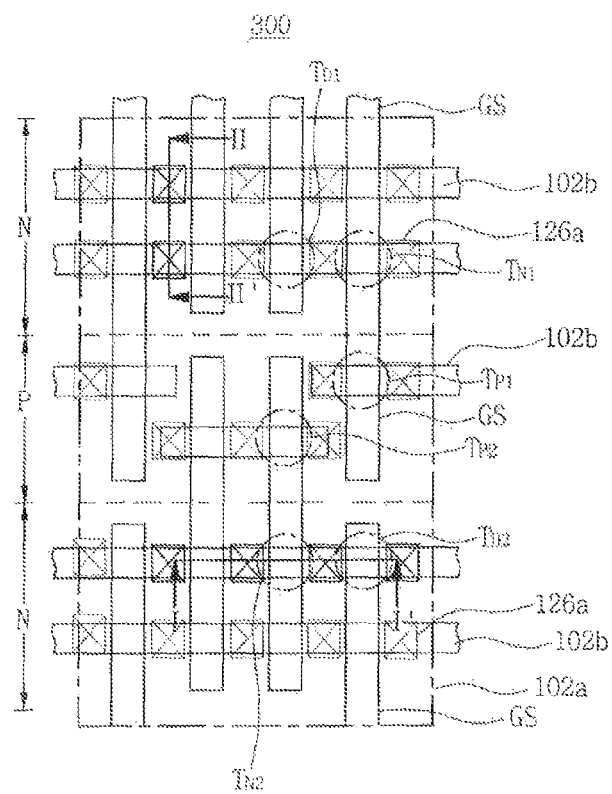
FIG. 42 is a layout of the memory device of FIG. 41 in accordance with an exemplary embodiment of the present inventive concept.
Figure 43:
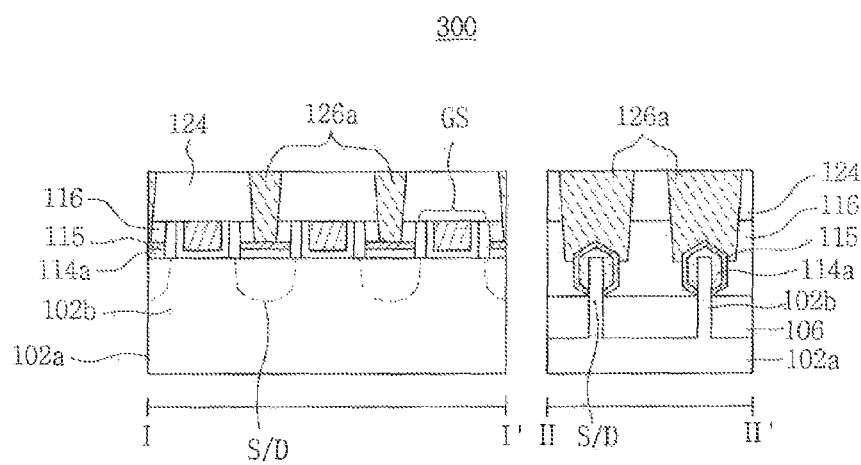
FIGS. 43 and 44 are schematic cross-sectional views taken along lines I-I' and II-II' shown in FIG. 42.
Figure 44:
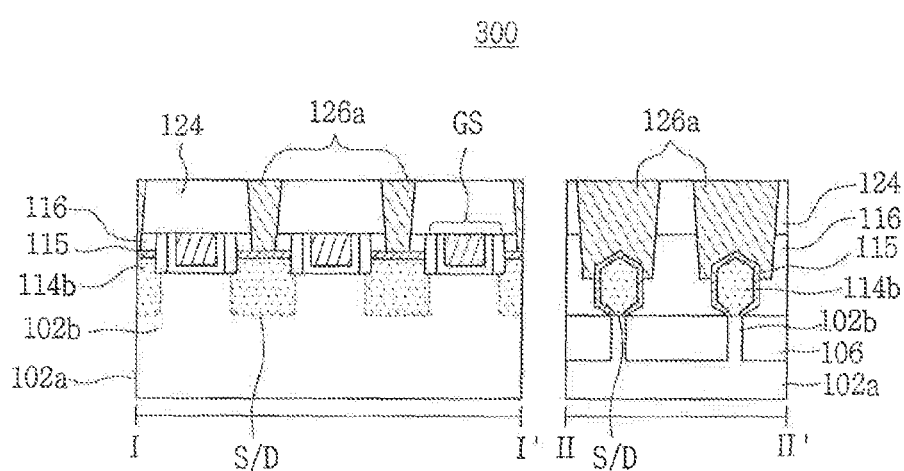

FIG. 41 is an equivalent circuit diagram of a memory device according to an exemplary embodiment of the present inventive concept. FIG. 42 is a layout of the memory device of FIG. 41 according to an exemplary embodiment of the present inventive concept. FIGS. 43 and 44 are schematic cross-sectional views taken along lines I-I' and II-II' shown in FIG. 42. The memory device is a SRAM of which unit memory cell is formed of six transistors.

Referring to FIG. 41, the memory device 300 of an SRAM is a unit memory cell formed of six transistors. The unit cell may perform a read/write operation by operating two inverters. The unit memory cell may include N-type transistors $T_{D1}$, $T_{N1}$, $T_{D2}$, and $T_{N2}$, P-type transistors $T_{P1}$ and $T_{P2}$, bit lines BL1 and BL2, and a word line WL. The bit lines includes a first bit line BL1 and a second bit line BL2. The word line WL is connected to gate terminals of the driving transistors $T_{D1}$ and $T_{D2}$, the first bit line BL is connected to a terminal of a first driving transistor $T_{D1}$, and the second bit line BL2 is connected to a terminal of a second driving transistor $T_{D2}$. The transistors $T_{N1}$ to $T_{P1}$ and $T_{N2}$ to $T_{P2}$ are cross-coupled inverters to store data. The transistors $T_{D1}$ to $T_{D2}$ are access transistors to perform the read/write operation, and the bit lines BL1 and BL2 are part of data path to read and write data. The word line WL is a control signal line to switch the access transistors $T_{D1}$ to $T_{D2}$.

The above-described semiconductor devices according to an exemplary embodiment may be applied to the N-type transistors and the P-type transistors configured as described above.

Referring to FIGS. 42, 43, and 44, the memory device 300 of FIG. 41 includes a substrate having N-regions N and a P-region P. N-type transistors $T_{D1}$, $T_{N1}$, $T_{D2}$, and $T_{N2}$ are formed in the N-regions N, and P-type transistors $T_{P1}$ and, $T_{P2}$ are formed in the P-region P. The N-type transistors $T_{D1}$, $T_{N1}$, $T_{D2}$, and $T_{N2}$ and the P-type transistors $T_{P1}$ and, $T_{P2}$ include active fins 102b which extend in a direction. Gate structures GS cross the active fins 102b. The above-described sources/drains 114a may be formed on side surfaces and upper surfaces of the active fins 102b located between the spaced gate structures GS by crystal growth. Source/drain contacts 126a which contact the sources/drains 114a are disposed between the gate structures GS. In this case, adjacent transistors of the same type share the source/drain contacts 126a. If the semiconductor device 100a of FIG. 1 is applied, the sources/drains 114a, shown in FIG. 43, are formed by crystal growth without recessing both sides of the active fin 102b which do not cross the gate structure GS. In this case, the lower surface of the gate structure GS and the surface of the active fin 102b located under the source/drain contact 126a are coplanar.

Alternatively, if the semiconductor device 100b of FIG. 7 is applied, the sources/drains 114b, as shown in FIG. 44, are formed by crystal growth on recessed surfaces of the active fin 102b. The recessed surfaces are not overlapped with the gate structure GS. Therefore, the active fin 102b has an uneven upper surface in a cross section. The source/drain contacts 126a are in contact with auxiliary contact layers 115 having a shape of FIG. 7.

Figure 45:
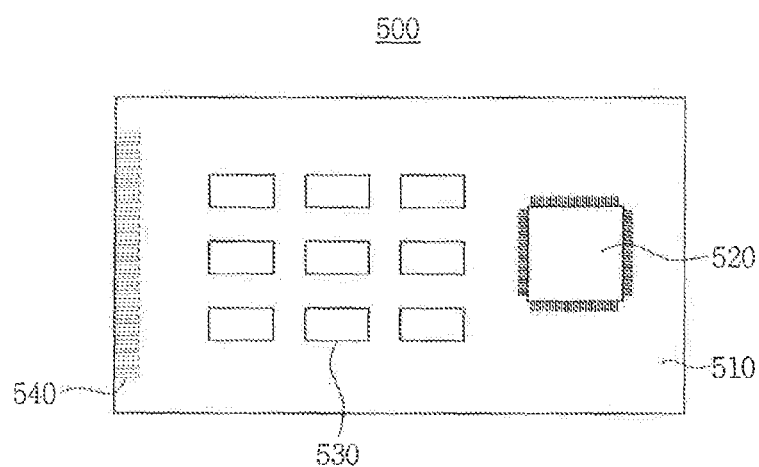
FIG. 45 is semiconductor module having a semiconductor device fabricated in accordance with an exemplary embodiment of the present inventive concept.

FIG. 45 is a semiconductor module having a semiconductor device fabricated according to an exemplary embodiment of the present inventive concept.

Referring to FIG. 45, the semiconductor module 500 includes a semiconductor device 530 according to an exemplary embodiment. The semiconductor device 530 is mounted on a semiconductor module substrate 510. The semiconductor module 500 further includes a microprocessor 520 mounted on the semiconductor module substrate 510. Input/output terminals 540 are disposed on at least one side of the semiconductor module substrate 510. The semiconductor module 500 may be included in a memory card or a solid state drive (SSD).

Figure 46:
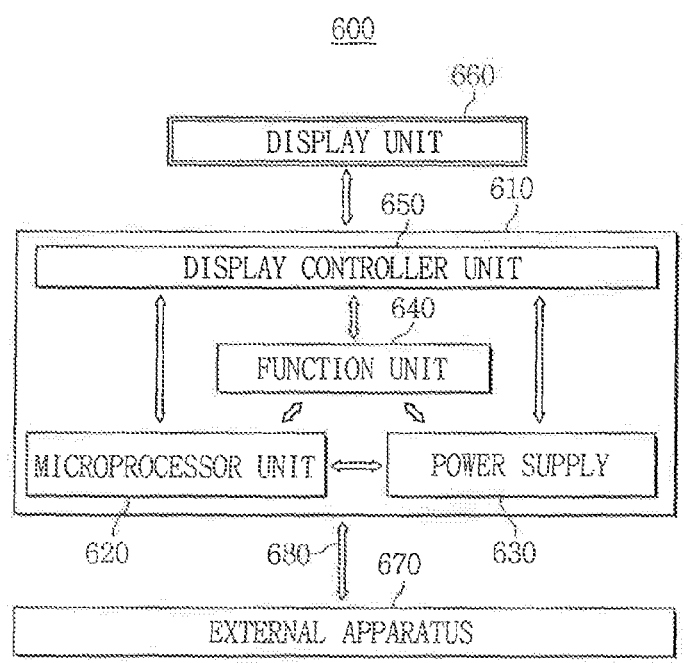
FIGS. 46 and 47 are block diagrams of electronic systems having a semiconductor device in accordance with an exemplary embodiment of the present inventive concept.

FIG. 46 is a block diagram of an electronic system having a semiconductor device according to an exemplary embodiment of the present inventive concept.

Referring to FIG. 46, a semiconductor device fabricated according to an exemplary embodiment of the present inventive concept is applied to the electronic system 600. The electronic system 600 includes a body 610, a microprocessor unit 620, a power supply 630, a function unit 640, and a display controller unit 650. The body 610 may include a system board or a motherboard having a PCB or the like.

The microprocessor unit 620, the power supply 630, the function unit 640, and the display controller unit 650 are mounted or disposed on the body 610. A display unit 660 is disposed on an upper surface of the body 610 or outside the body 610. For example, the display unit 660 is disposed on a surface of the body 610, displaying an image processed by the display controller unit 650. The power supply 630 receives a constant voltage from an external power supply, generating various voltage levels to supply the voltages to the microprocessor unit 620, the function unit 640, the display controller unit 650, etc. The microprocessor unit 620 receives a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video output to the display unit 660 or voice output to a speaker through communication with an external device 670, and when a camera is included, it may serve as an image processor. Alternatively, if the electronic system 600 is connected to a memory card to expand the capacity, the function unit 640 may serve as a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The function unit 640 may include a semiconductor device fabricated according to an exemplary embodiment of the present inventive concept.

Figure 47:
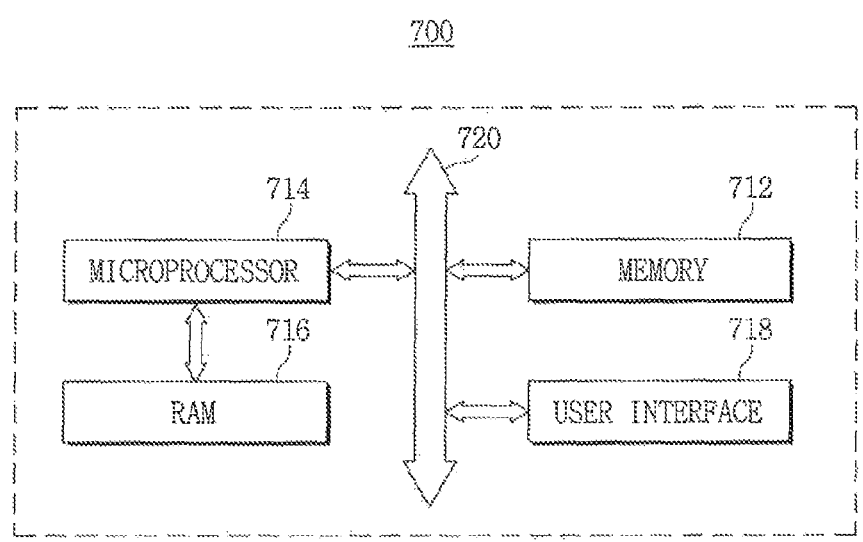

FIG. 47 is a block diagram of an electronic system having a semiconductor device fabricated according to an exemplary embodiment of the present inventive concept.

Referring to FIG. 47, the electronic system 700 may be included in a mobile device or a computer. For example, the electronic system 700 includes a memory system 712, a microprocessor 714, a RAM 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a semiconductor device fabricated according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

According to an exemplary embodiment, lateral growth of a crystal is suppressed and thus a source/drain having a side surface which is substantially parallel to side surfaces of an active fin to suppress adjacent sources/drains from being in contact with each other.

A growth rate of a crystal growth surface of the source/drain parallel to the side surface of the active fin is slow and thus adjacent sources/drains may be prevented from being in contact with each other at an early stage of crystal growth.

Adjacent sources/drains may be spaced apart so that a contact resistance between source/drains and source/drain contacts may be reduced by increasing contact areas therebetween, and current driving capability of the device may be increased.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
    a substrate;
    an active fin protruding from the substrate and extending in a direction;
    a gate structure crossing a first region of the active fin; and
    a source/drain disposed on a second region of the active fin,
    wherein the source/drain comprises upper surfaces and vertical side surfaces, wherein the vertical side surfaces are in substantially parallel with side surfaces of the active fin,
    wherein an upper surface of the first region of the active fin is coplanar with an upper surface of the second region of the active fin,
    wherein the source/drain is formed by crystal growth from the side surfaces and the upper surface of the active fin,
    wherein the substrate is a {100}/<110> substrate, the side surface of the active fin is a {110} surface, and the upper surface of the active fin is a {100} surface, and
    wherein the side surfaces of the source/drain are {110} surfaces and the upper surfaces of the source/drain are {111} surfaces.

2. The device of claim 1,
    wherein the substrate is a {110}/<110> substrate, the side surface of the active fin is a {100} surface, and the upper surface of the active fin is a {110} surface.

3. The device of claim 2,
    wherein the side surfaces of the source/drain are {100} surfaces and the upper surfaces of the source/drain are {111} surfaces.

4. A semiconductor device, comprising:
    a substrate;
    an active fin protruding from the substrate and extending in a direction;
    a gate structure crossing a first region of the active fin; and
    a source/drain disposed on a second region of the active fin,
    wherein the source/drain comprises upper surfaces and vertical side surfaces, wherein the vertical side surfaces are in substantially parallel with side surfaces of the active fin,
    wherein a first upper surface of the first region of the active fin is higher than a second upper surface of the second region of the active fin, and wherein a vertical side surface connects the first upper surface and the second upper surface,
    wherein the source/drain is formed by crystal growth from the vertical side surface and the second upper surface of the active fin,
    wherein the substrate is a {110}/<110> substrate, the second upper surface is a {110} surface, and the vertical side surface is a {100} surface, and
    wherein the side surfaces of the source/drain are {100} surfaces, and the upper surfaces of the source/drain are {111} surfaces.

5. The device of claim 1, further comprising an auxiliary contact layer covering the side and upper surfaces of the source/drain.

6. The device of claim 5,
    wherein the auxiliary contact layer is a silicide layer including at least one of WSi2, MoSi2, TiSi2 and CoSi2.

7. The device of claim 5, further comprising a source/drain which is in contact with the auxiliary contact layer.

8. The device of claim 7,
    wherein the auxiliary contact layer is interposed between the source/drain contact and the upper surfaces of the source/drain.

9. The device of claim 7,
    wherein the auxiliary contact layer is interposed between the source/drain contact and the upper surfaces and the side surfaces of the source/drain.

10. The device of claim 7,
    wherein the auxiliary contact layer is interposed between the source/drain contact and the upper surfaces and one side surface of the source/drain.

11. The device of claim 1,
    wherein an end part of the active fin is a rounded shape.

12. The device of claim 1,
    wherein the gate structure comprises a gate dielectric layer disposed along the side surfaces and an upper surface of the active fin, a gate electrode disposed along the gate dielectric layer, and a spacer disposed on side surfaces of the gate electrode.

* * * * *

UNITED STATES PATENT AND TRADEMARK OFFICE
CERTIFICATE OF CORRECTION

PATENT NO. : 9,466,724 B2  Page 1 of 1
APPLICATION NO. : 14/704485
DATED : October 11, 2016
INVENTOR(S) : Yang et al.

It is certified that error appears in the above-identified patent and that said Letters Patent is hereby corrected as shown below:

On the Title Page

Under abstract --12 Claims, 31 Drawing Sheets-- should read --10 Claims, 31 Drawing Sheets--.

In the Claims

Column 19, delete Line 34 to Line 40 of Claims 2 and 3.

Column 20, Line 45-Line 46, "--an upper surface--" should read "--the upper surface--".

Column 20, Line 46, "--the active fin--" should read "--the first region of the active fin--".

Signed and Sealed this
Eleventh Day of April, 2017

Michelle K. Lee
*Director of the United States Patent and Trademark Office*